(12) United States Patent
Lee et al.

(10) Patent No.: US 12,120,943 B2
(45) Date of Patent: Oct. 15, 2024

(54) DISPLAY DEVICE AND METHOD OF MANUFACTURING THE SAME

(71) Applicant: Samsung Display Co., LTD., Yongin-si (KR)

(72) Inventors: Wang Woo Lee, Osan-si (KR); Sung Ho Kim, Suwon-si (KR); Hyeon Sik Kim, Yongin-si (KR); Joon Hyoung Park, Seongnam-si (KR); Seok Je Seong, Seongnam-si (KR); Jin Sung An, Suwon-si (KR); Jin Seok Oh, Pyeongtaek-si (KR); Min Woo Woo, Seoul (KR); Ji Seon Lee, Seoul (KR); Pil Suk Lee, Hwaseong-si (KR); Yun Sik Joo, Suwon-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 18/363,944

(22) Filed: Aug. 2, 2023

(65) Prior Publication Data

US 2023/0380256 A1 Nov. 23, 2023

Related U.S. Application Data

(62) Division of application No. 17/142,818, filed on Jan. 6, 2021, now Pat. No. 11,758,798.

(30) Foreign Application Priority Data

Feb. 26, 2020 (KR) .................. 10-2020-0023624

(51) Int. Cl.
*H10K 59/131* (2023.01)
*H10K 59/121* (2023.01)
(Continued)

(52) U.S. Cl.
CPC ....... *H10K 77/111* (2023.02); *H10K 59/1213* (2023.02); *H10K 59/131* (2023.02);
(Continued)

(58) Field of Classification Search
CPC .... H10K 77/111; H10K 59/131; H10K 71/00; H10K 71/80; H10K 59/1213; H10K 59/1201
(Continued)

(56) References Cited

U.S. PATENT DOCUMENTS

2014/0140019 A1   5/2014   Park et al.
2015/0123084 A1   5/2015   Kim et al.
(Continued)

FOREIGN PATENT DOCUMENTS

KR   10-2018-0130613   12/2018
KR   10-2019-0132603   11/2019

OTHER PUBLICATIONS

Korean Office Action, with English Translation, for Korean Patent Application No. 10-2020-0023624, dated Dec. 22, 2023.

*Primary Examiner* — Dzung Tran
(74) *Attorney, Agent, or Firm* — KILE PARK REED & HOUTTEMAN PLLC

(57) ABSTRACT

A display device includes a supporting substrate including a polymeric material, base substrate disposed on an upper surface of the supporting substrate, a pixel array disposed in a display area of the base substrate, a transfer wiring disposed in a bending area of the base substrate and electrically connected to the pixel array, and an organic filling portion disposed under the transfer wiring in the bending area. The base substrate includes an organic film including a polymeric material, and an inorganic barrier film overlapping the organic film and extending outwardly from an edge
(Continued)

of the organic film. The organic filling portion contacts the organic film of the base substrate.

14 Claims, 20 Drawing Sheets

(51) Int. Cl.
| | |
|---|---|
| *H10K 71/00* | (2023.01) |
| *H10K 71/80* | (2023.01) |
| *H10K 77/10* | (2023.01) |
| *H01L 27/12* | (2006.01) |
| *H01L 29/66* | (2006.01) |
| *H01L 29/786* | (2006.01) |
| *H10K 59/12* | (2023.01) |
| *H10K 102/00* | (2023.01) |

(52) U.S. Cl.
CPC ............ *H10K 71/00* (2023.02); *H10K 71/80* (2023.02); *H01L 27/1218* (2013.01); *H01L 27/1225* (2013.01); *H01L 27/124* (2013.01); *H01L 27/1251* (2013.01); *H01L 27/1266* (2013.01); *H01L 27/127* (2013.01); *H01L 27/1288* (2013.01); *H01L 29/66757* (2013.01); *H01L 29/66969* (2013.01); *H01L 29/78675* (2013.01); *H01L 29/7869* (2013.01); *H10K 59/1201* (2023.02); *H10K 2102/311* (2023.02)

(58) Field of Classification Search
USPC .......................................................... 257/40
See application file for complete search history.

(56) References Cited

U.S. PATENT DOCUMENTS

| | | |
|---|---|---|
| 2016/0181339 A1 | 6/2016 | Lee et al. |
| 2017/0141169 A1 | 5/2017 | Sim et al. |
| 2017/0278901 A1 | 9/2017 | Kim et al. |
| 2018/0308869 A1 | 10/2018 | Suzumura et al. |
| 2019/0006521 A1 | 1/2019 | Noh et al. |
| 2019/0140216 A1 | 5/2019 | Shin et al. |
| 2019/0355799 A1 | 11/2019 | Jeong et al. |
| 2022/0149131 A1 | 5/2022 | Lee et al. |

DISPLAY DEVICE AND METHOD OF MANUFACTURING THE SAME

CROSS-REFERENCE TO RELATED APPLICATION(S)

This is a divisional application of U.S. patent application Ser. No. 17/142,818 filed Jan. 6, 2021 (now pending), the disclosure of which is incorporated herein by reference in its entirety. U.S. patent application Ser. No. 17/142,818 claims priority to and benefits of Korean Patent Application No. 10-2020-0023624 under 35 U.S.C. § 119, filed on Feb. 26, 2020 in the Korean Intellectual Property Office (KIPO), the entire contents of which are incorporated herein by reference.

BACKGROUND

1. Technical Field

Embodiments relate to an organic light-emitting display device and a method of manufacturing an organic light-emitting display device.

2. Description of the Related Art

An organic light-emitting display device may be able to emit a light for itself without an individual light source. The organic light-emitting display device may feature reduced weight and thickness and has characteristics appropriate for a display device.

The organic light-emitting display device may include a flexible base substrate formed from a polymeric material. For example, the flexible base substrate may be formed on a carrier substrate such as a glass substrate. After a driving element, a light-emitting element, an encapsulation layer, or the like may be formed on the flexible base substrate, the carrier substrate may be removed to form the organic light-emitting display device having the flexible base substrate.

In case that the driving element, the light-emitting element and the encapsulation layer may be formed on the flexible base substrate, the carrier substrate needs to be stably adhered to the flexible base substrate.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide a display device having improved reliability.

Embodiments may provide a method of manufacturing the display device.

According to an embodiment, a display device may include a supporting substrate including a polymeric material, a base substrate disposed on an upper surface of the supporting substrate, a pixel array disposed in a display area of the base substrate, a transfer wiring disposed in a bending area of the base substrate and electrically connected to the pixel array, and an organic filling portion disposed under the transfer wiring in the bending area. The base substrate may include an organic film including a polymeric material, and an inorganic barrier film overlapping the organic film and extending outwardly from an edge of the organic film. The organic filling portion may contact the organic film of the base substrate.

In an embodiment, a width of a portion of the inorganic barrier film extending outwardly from the edge of the organic film, may be equal to or more than about 3 mm.

In an embodiment, the pixel array may include an organic light-emitting diode and a transistor driving the organic light-emitting diode.

In an embodiment, the transistor may include a first transistor including a polysilicon channel, and a second transistor including a metal oxide channel.

According to an embodiment, a method for manufacturing a display device may be provided. According to the method, a base substrate may be formed on a carrier substrate. The base substrate may include an organic film including a polymeric material, and an inorganic barrier film overlapping the organic film and extending outwardly from an edge of the organic film. A first active pattern including a semiconductive material may be formed in a display area of the base substrate. A first interlayer insulation layer may be formed on the first active pattern. A second active pattern may be formed on the first interlayer insulation layer in the display area of the base substrate. The second active pattern may include a semiconductive material different from the first active pattern. A second interlayer insulation layer may be formed on the second active pattern. A photoresist film may be formed on the second interlayer insulation layer. The photoresist film may be exposed to light through a first mask including a first transmitting portion overlapping the first active pattern or the second active pattern, and a second transmitting portion disposed between an edge of the carrier substrate and the edge of the organic film. An edge portion of the photoresist film may be exposed to light, the edge portion of the photoresist film overlapping the edge of the carrier substrate. The photoresist film may be developed to form a first photoresist pattern that includes a first opening and does not overlap the edge of the carrier substrate. The first opening may overlap the first active pattern or the second active pattern. A contact hole exposing the first active pattern or the second active pattern may be formed by using the first photoresist pattern as a mask.

In an embodiment, the first mask may further include a third transmitting portion overlapping a bending area of the base substrate. The first photoresist pattern may further include a second opening overlapping the bending area. The second interlayer insulation layer may be etched in the bending area upon formation of the contact hole.

In an embodiment, the contact hole may expose the first active pattern. A second photoresist pattern may be formed on the second interlayer insulation layer. The second photoresist pattern may include a first opening overlapping the second active pattern, and a second opening overlapping the bending area. A contact hole exposing the second active pattern may be formed by using the second photoresist pattern as a mask. A first source metal pattern may be formed. The first source metal pattern may include a first source pattern electrically contacting the first active pattern, a first drain pattern electrically contacting the first active pattern and spaced apart from the first source pattern, a second source pattern electrically contacting the second active pattern, and a second drain pattern electrically contacting the second active pattern and spaced apart from the second source pattern. A third photoresist pattern overlapping the first source metal pattern and including an opening overlapping the bending area may be formed. The inorganic barrier film may be etched in the bending area by using the third photoresist pattern as a mask to expose the organic film.

In an embodiment, an organic filling portion may be formed on an exposed portion of the organic film.

In an embodiment, a second source metal pattern may be formed. The second source metal pattern includes a transfer wiring disposed on the organic filling portion and a connection electrode electrically contacting the first drain pattern.

In an embodiment, the inorganic barrier film includes a portion that extends outwardly from the edge of the organic film and remains after the inorganic barrier film may be etched in the bending area. The portion may have a width equal to or more than about 3 mm.

In an embodiment, the second transmitting portion may overlap a portion of the inorganic barrier film protruding from the edge of the organic film.

In an embodiment, the second transmitting portion may extend along the edge of the carrier substrate.

In an embodiment, the edge portion of the photoresist film may be exposed to light without using a mask.

In an embodiment, the light-exposed edge portion of the photoresist film may overlap an area, which may be light-exposed through the second transmitting portion of the first mask.

In an embodiment, the light-exposed edge portion of the photoresist film may have a frame shape surrounding the base substrate.

In an embodiment, the first active pattern may include polysilicon, and the second active pattern may include a metal oxide.

In an embodiment, the base substrate may include organic films.

In an embodiment, the carrier substrate may be separated from the base substrate.

According to an embodiment, a method for manufacturing a display device may be provided. According to the method, a base substrate may be formed on a carrier substrate. The base substrate may include an organic film including a polymeric material, and an inorganic barrier film overlapping the organic film and extending outwardly from an edge of the organic film. An active pattern including a semiconductive material may be formed in a display area of the base substrate. An interlayer insulation layer may be formed on the active pattern. A photoresist film may be formed on the interlayer insulation layer. The photoresist film may be exposed to light through a first mask including a first transmitting portion overlapping the active pattern and a second transmitting portion disposed between an edge of the carrier substrate and the edge of the organic film. An edge portion of the photoresist film may be exposed to a light. The edge portion of the photoresist film may overlap the edge of the carrier substrate. The photoresist film may be developed to form a first photoresist pattern that includes a first opening and does not overlap the edge of the carrier substrate. The first opening may overlap the active pattern. A contact hole exposing the active pattern may be formed by using the first photoresist pattern as a mask.

The second transmitting portion may overlap a portion of the inorganic barrier film extending outwardly from the edge of the organic film. The light-exposed edge portion of the photoresist film may overlap an area light-exposed through the second transmitting portion of the first mask.

According to embodiments, an area light-exposed by an edge-exposure part, which may have a relatively great process margin (size of misalignment), may be reduced, a peripheral area of a carrier substrate may be further exposed to a light through a mask to compensate for the reduced area light-exposed by the edge-exposure part. Thus, an area where an inorganic layer may contact the carrier substrate may be substantially increased while preventing a photoresist from remaining in the peripheral area of the carrier substrate.

Furthermore, in the above etching processes, inorganic layers may be removed in a bending area. Thus, reliability deterioration due to cracking of an inorganic layer remaining in the bending area may be prevented.

BRIEF DESCRIPTION OF THE DRAWINGS

Aspects of one or more embodiments of the inventive concept will be more clearly understood from the following detailed description taken in conjunction with the accompanying drawings.

DETAILED DESCRIPTION OF THE EMBODIMENTS

A display device and a method of manufacturing a display device according to embodiments of the inventive concept will be described hereinafter with reference to the accompanying drawings.

Use of the singular form (e.g., "a", "an", "the") may include plural forms as well, unless the context clearly indicates otherwise.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1:
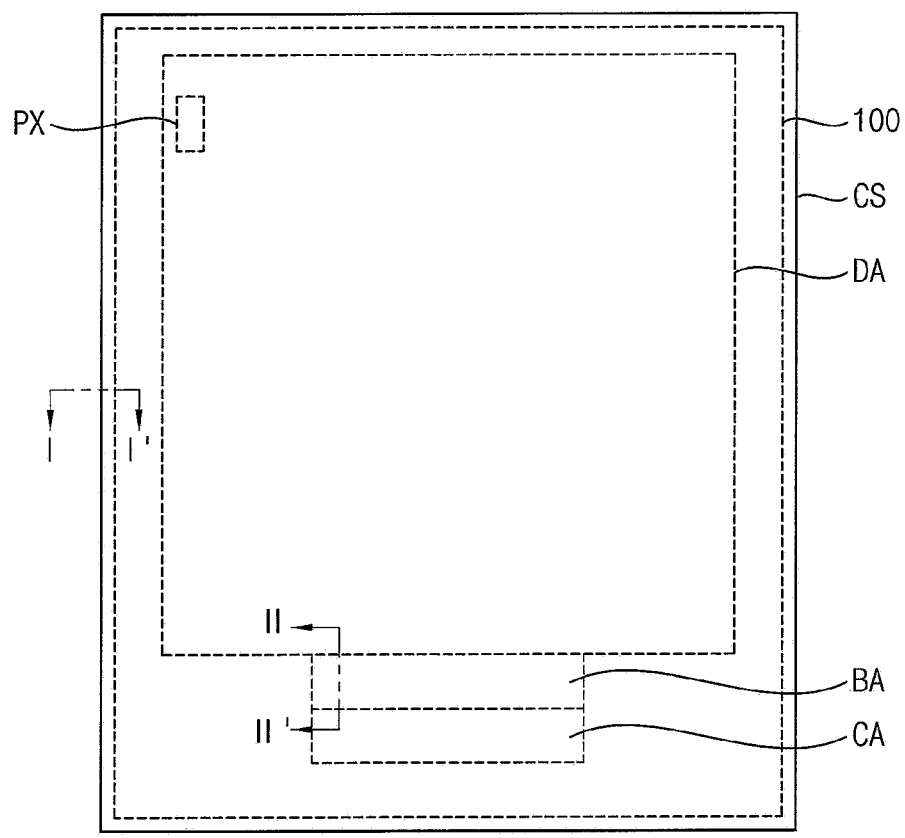
FIGS. 1, 7 and 12 are schematic plan views illustrating a method for manufacturing a display device according to an embodiment.
Figure 6:
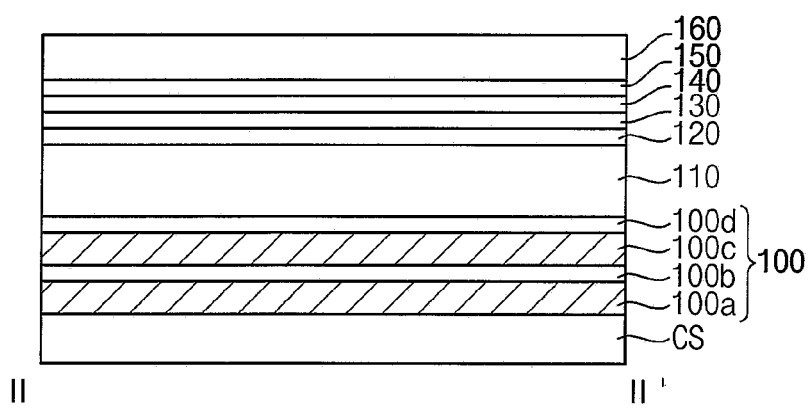
Figure 7:
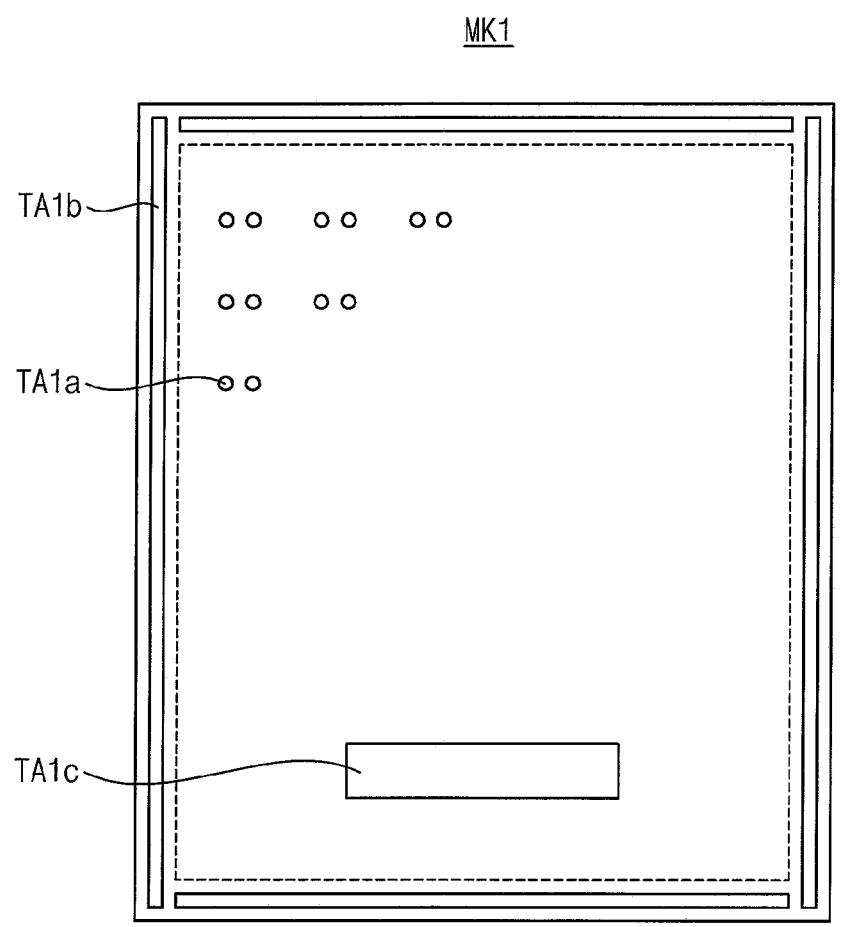
Figure 8:
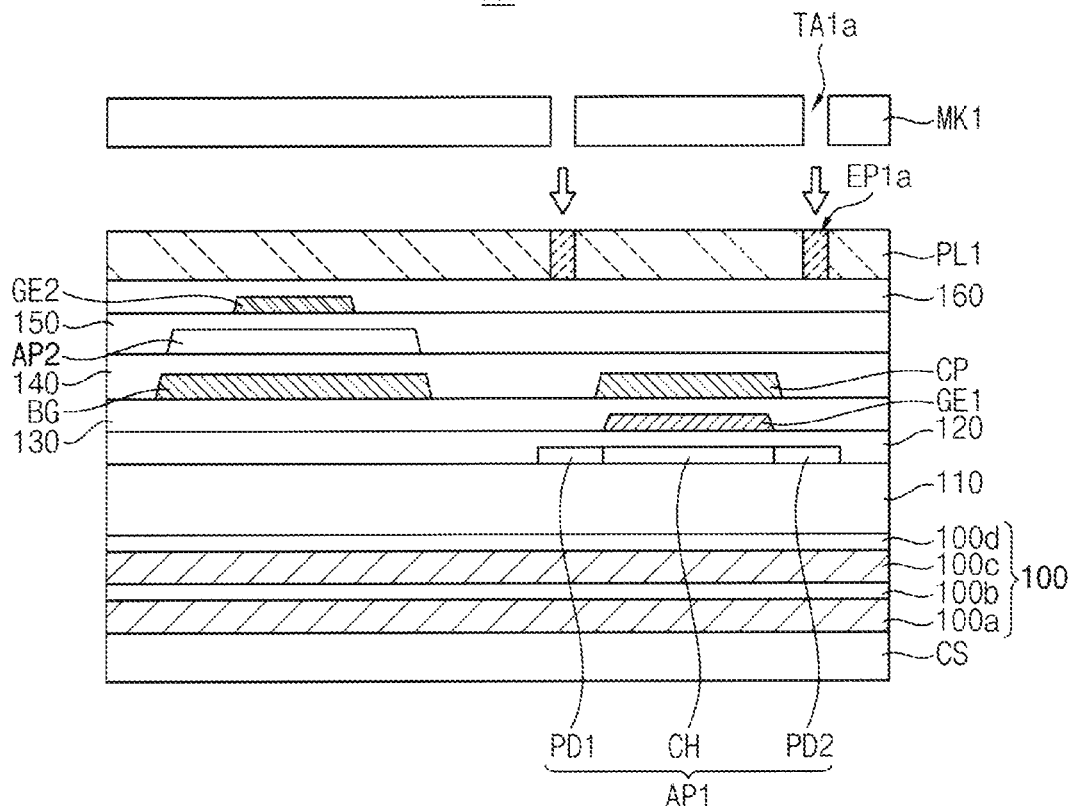
Figure 9:
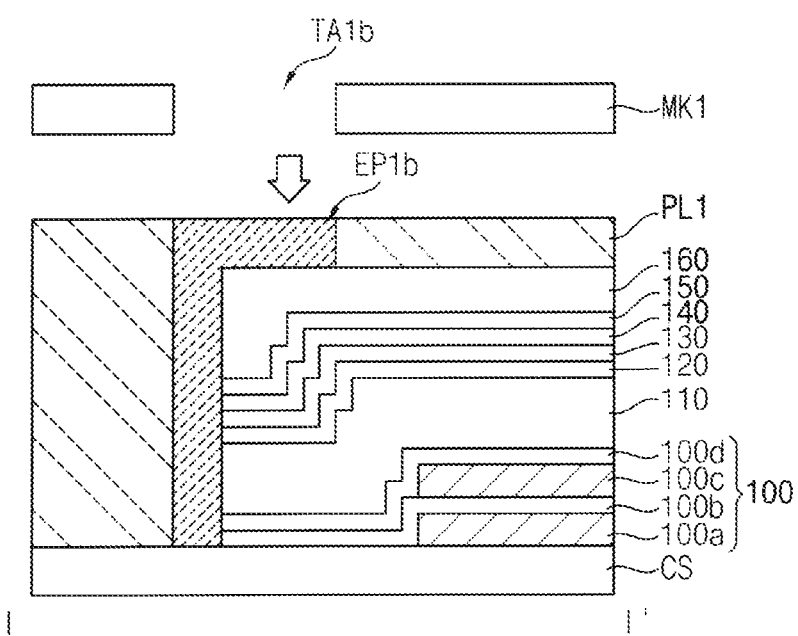
Figure 10:
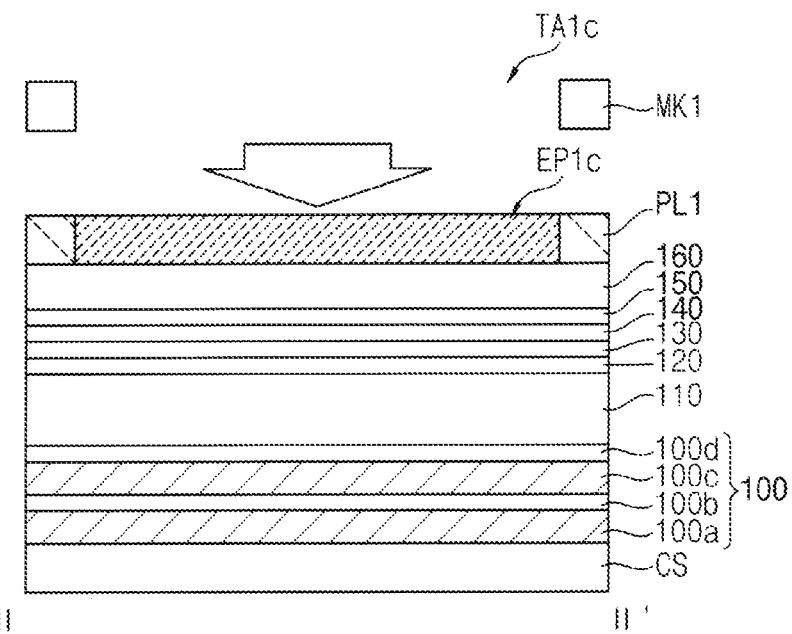
Figure 11:
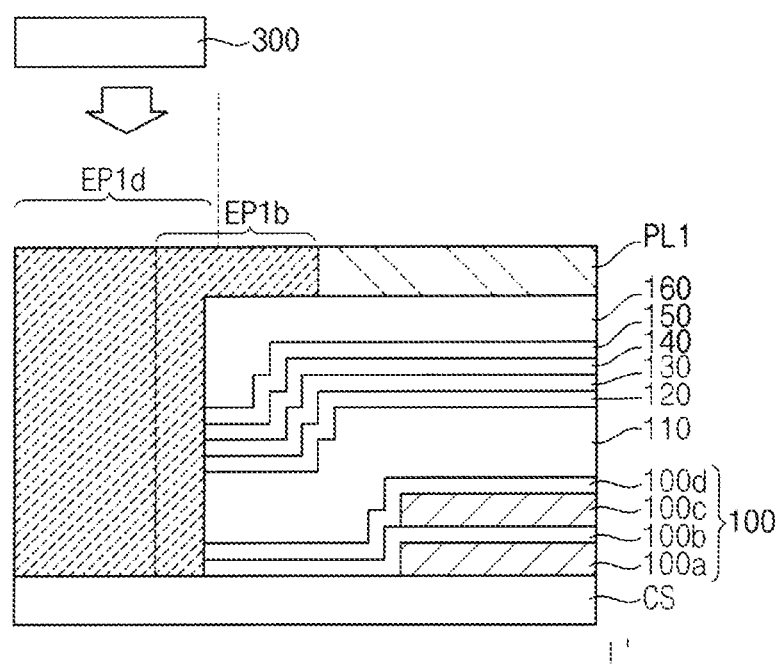
Figure 12:
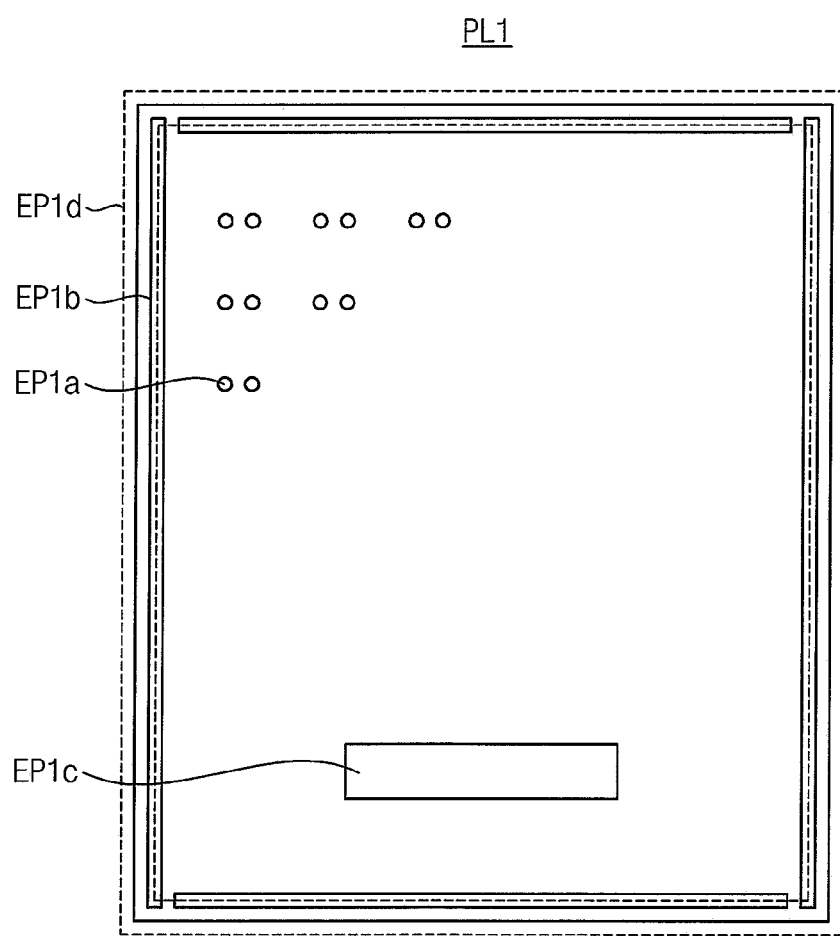

FIGS. 1, 7 and 12 are schematic plan views illustrating a method for manufacturing a display device according to an embodiment. FIGS. 2, 3, 4, 5, 6, 8, 9, 10, 11, 13, 14, 15, 16, 17, 18, 19, 20, 21, 22, 23, 24, 25, 26, 27, 28, 29, 30, 31, 32 and 33 are schematic cross-sectional views illustrating a method for manufacturing a display device according to an embodiment. FIGS. 2, 4, 8, 13, 16, 19, 23, 26, 29, 31 and 32 may illustrate a cross-section of a pixel of the display device illustrated in FIG. 1. FIGS. 3, 5, 9, 11, 14, 17, 20, 22, 24, 27 and 33 may illustrate a cross-section taken along the line I-I' of FIG. 1. FIGS. 6, 10, 15, 18, 21, 25, 28 and 30 may illustrate a cross-section taken along the line II-II' of FIG. 1.

Figure 2:
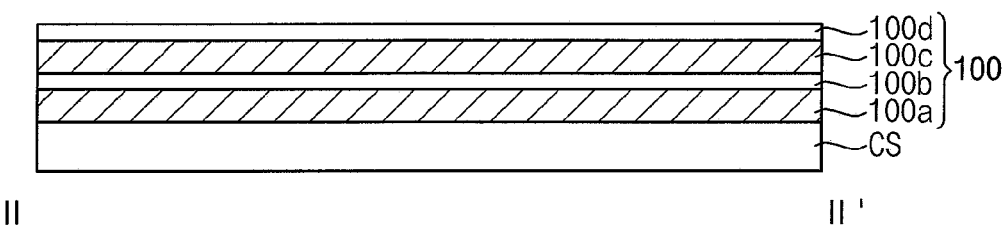
FIGS. 2, 3, 4, 5, 6, 8, 9, 10, 11, 13, 14, 15, 16, 17, 18, 19, 20, 21, 22, 23, 24, 25, 26, 27, 28, 29, 30, 31, 32 and 33 are schematic cross-sectional views illustrating a method for manufacturing a display device according to an embodiment.
Figure 3:
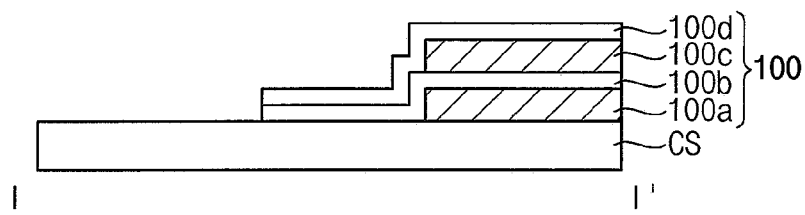

Referring to FIGS. 1 to 3, a base substrate 100 may be formed on a carrier substrate CS.

The carrier substrate CS may include a rigid material. For example, the carrier substrate CS may include glass, quartz, or the like, or a combination thereof.

The base substrate 100 may have a stacked structure including an organic film and an inorganic barrier film. For example, the base substrate 100 may include a first organic film 100a, a first inorganic barrier film 100b, a second organic film 100c and a second inorganic barrier film 100d, which may be sequentially stacked on each other. However, embodiments are not limited thereto. For example, the base substrate 100 may include three or more organic films and three or more inorganic barrier films, or may include one organic film and one inorganic barrier film.

The first and second organic films 100a and 100c may include a polymeric material. For example, the first and second organic films 100a and 100c may each include polyethylene terephthalate, polyethylene naphthalate, polyether ketone, polycarbonate, polyarylate, polyether sulfone, polyimide, or a combination thereof. For example, a composition including a polymer or a polymer precursor may be coated on the carrier substrate CS, and dried and/or cured to form the first organic film 100a. The second organic film 100c may be formed on the first inorganic barrier film 100b through processes similar to those for the first organic film 100a. In an embodiment, the first organic film 100a may contact an upper surface of the carrier substrate CS.

The first and second inorganic barrier films 100b and 100d may include an inorganic material. For example, the first and second inorganic barrier films 100b and 100d may each include silicon oxide, silicon nitride, silicon oxynitride, or a combination thereof. The first and second inorganic barrier films 100b and 100d may be formed by vacuum deposition, chemical vaporization deposition, or the like.

As illustrated in FIG. 3, the first and second inorganic barrier films 100b and 100d may have a width greater than the first and second organic films 100a and 100c. For example, the first inorganic barrier film 100b may extend outwardly from an edge of the first organic film 100a such that a portion of the first inorganic barrier film 100b contacts the carrier substrate CS. The second inorganic barrier film 100d may extend outwardly from an edge of the second organic film 100c such that a portion of the second inorganic barrier film 100d contacts the first inorganic barrier film 100b.

In an embodiment, the first and second inorganic barrier films 100b and 100d may be deposited by using a same mask so that edges of the first and second inorganic barrier films 100b and 100d may coincide with each other, in a plan view. However, embodiments are not limited thereto. For example, edges of the first and second inorganic barrier films 100b and 100d may be spaced apart from each other in a horizontal direction, in a plan view.

Referring to FIGS. 1 and 3, an edge of the base substrate 100 may be spaced apart from an edge of the carrier substrate CS in a horizontal direction, in a plan view.

The base substrate 100 may include a display area DA, a bending area BA and a connection area CA. An array of pixels PX may be disposed in the display area DA. A pad part may be formed in the connection area CA to be electrically connected to a driving device. After the display device may be manufactured, the bending area BA may bend so that the connection area CA may be disposed under the display area DA.

Figure 4:
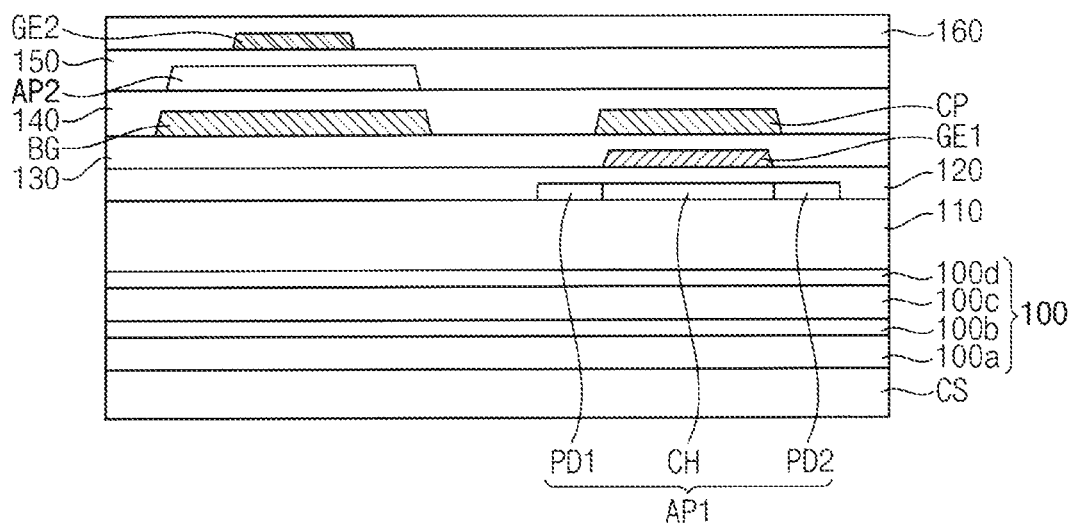

Referring to FIG. 4, a buffer layer 110 may be formed on the base substrate 100. A first active pattern AP1 may be formed on the buffer layer 110 in the area of the pixel PX.

The buffer layer 110 may prevent or reduce penetration of impurities, humidity or external gas from underneath of the base substrate 100, and may reduce a roughness of an upper surface of the base substrate 100. The buffer layer 110 may include an inorganic material. For example, the buffer layer 110 may include silicon oxide, silicon nitride, silicon oxynitride, or a combination thereof. The buffer layer 110 may have a single-layered structure or a multiple-layered structure including multiple layers including different materials.

In an embodiment, the first active pattern AP1 may include polycrystalline silicon (polysilicon). For example, an amorphous silicon layer may be formed on the buffer layer 110 and crystallized to form a polysilicon layer.

For example, the amorphous silicon layer may be formed through sputtering, low-pressure chemical vapor deposition (LPCVD), plasma-enhanced chemical vapor deposition (PECVD), or the like. The amorphous silicon layer may be crystallized through excimer laser annealing (ELA), sequential lateral solidification (SLS), or the like.

For example, the polysilicon layer may be polished by chemical mechanical polishing (CMP) or the like to planarize a surface thereof. The polysilicon layer may be patterned by a photolithography or the like to form a semiconductor pattern.

At least a portion of the semiconductor pattern may be doped with impurities. In an embodiment, the semiconductor pattern may be doped with p-type impurities such as boron or the like. However, embodiments are not limited thereto. For example, the semiconductor pattern may be doped with n-type impurities such as phosphor, arsenic, or the like. For example, the semiconductor may have different concentrations of the n-type impurities in different portions.

For example, the semiconductor pattern may be doped by using a first gate electrode GE1 or a photoresist pattern used for forming the first gate electrode GE1 as a mask, after the first gate electrode GE1 may be formed.

As a result, a peripheral portion of the semiconductor pattern, which may not overlap the first gate electrode GE1, may be doped with the impurities to form a first doped area PD1 and a second doped area PD2. In the semiconductor pattern, a portion overlapping the first gate electrode GE1 may remain without being doped to define a channel area CH.

Thus, the first doped area PD1, the second doped area PD2 and the channel area CH may be disposed continuously in a same layer. The pattern including the first doped area PD1, the second doped area PD2 and the channel area CH1 may define the first active pattern AP1.

A first insulation layer 120 may be formed on the first active pattern AP1. For example, the first insulation layer 120 may include silicon oxide, silicon nitride, silicon oxynitride, or a combination thereof. Furthermore, the first insulation layer 120 may include an insulating metal oxide such as aluminum oxide, tantalum oxide, hafnium oxide, zirconium oxide, titanium oxide, or a combination thereof. For example, the first insulation layer 120 may have a single-layered structure or a multiple-layered structure including silicon nitride and/or silicon oxide. The first insulation layer 120 may be referred to as a first gate insulation layer.

A first gate metal layer may be formed on the first insulation layer 120, and patterned to form a first gate metal pattern including the first gate electrode GE1. A second insulation layer 130 may be formed on the first gate metal pattern. A second gate metal layer may be formed on the second insulation layer 130, and patterned to form a second gate metal pattern including a capacitor pattern CP. A third insulation layer 140 may be formed on the second gate metal pattern.

The first and second gate metal layers may each include a metal, a metal alloy, a metal nitride, a conductive metal oxide, or the like, or a combination thereof. For example, the first and second gate metal layers may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multiple-layered structure including different metal layers.

The capacitor pattern CP may define a capacitor electrode of a storage capacitor. The second gate metal pattern may further include a lower gate pattern BG. The lower gate pattern BG may be disposed under a second active pattern AP2 to block a light entering into the second active pattern AP2 and to function as a lower gate electrode. The second gate metal pattern may further include a signal wiring to transfer an initiation signal, a light-emitting signal, or the like.

The second and third insulation layers 130 and 140 may include an organic material. For example, the second and third insulation layers 130 and 140 may each include silicon oxide, silicon nitride, silicon oxynitride, or a combination thereof. Furthermore, the second and third insulation layers 130 and 140 may each include an insulating metal oxide such as aluminum oxide, tantalum oxide, hafnium oxide, zirconium oxide, titanium oxide, or a combination thereof. For example, the second insulation layer 130 may include silicon nitride, and the third insulation layer 140 may include silicon oxide. The second insulation layer 130 may be referred to as a second gate insulation layer, and the third insulation layer 140 may be referred to as a first interlayer insulation layer.

A second active pattern AP2 may be formed on the third insulation layer 140. A fourth insulation layer 150 may be formed on the second active pattern AP2. A third gate metal pattern including a second gate electrode GE2 may be formed on the fourth insulation layer 150. A fifth insulation layer 160 may be formed on the third gate metal pattern.

The second active pattern AP2 may include a metal oxide semiconductor. For example, the second active pattern AP2 may include a two-component compound (ABx), a ternary compound (ABxCy) or a four-component compound (ABxCyDz), which may include at least one of indium (In), zinc (Zn), gallium (Ga), tin (Sn), titanium (Ti), aluminum (Al), hafnium (Hf), zirconium (Zr), and magnesium (Mg). For example, the second active pattern AP2 may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like, or a combination thereof.

The fourth and fifth insulation layers 150 and 160 may include an inorganic material. For example, the fourth and fifth insulation layers 150 and 160 may each include silicon oxide, silicon nitride, silicon oxynitride, or a combination thereof. Furthermore, the fourth and fifth insulation layers 150 and 160 may each include an insulating metal oxide such as aluminum oxide, tantalum oxide, hafnium oxide, zirconium oxide, titanium oxide, or a combination thereof. For example, the fourth and the fifth insulation layers 150 and 160 may each include silicon oxide. The fourth insulation layer 150 may be referred to as a third gate insulation layer, and the fifth insulation layer 160 may be referred to as a second interlayer insulation layer.

The third gate metal layer may include a metal, a metal alloy, a metal nitride, a conductive metal oxide, or the like, or a combination thereof. For example, the third gate metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multiple-layered structure including different metal layers.

Figure 5:
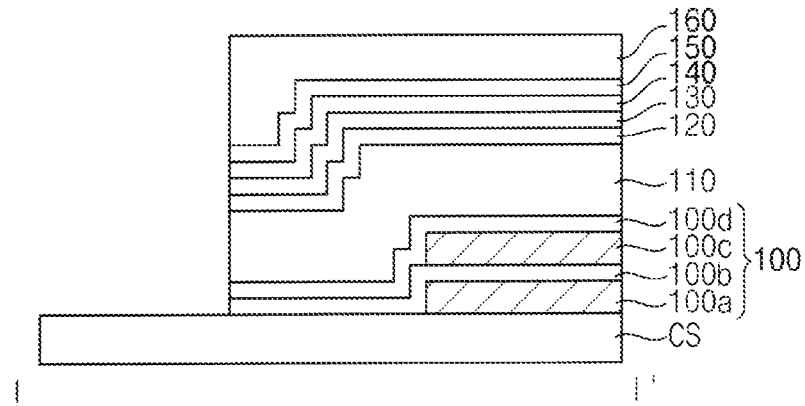

Referring to FIG. 5, at least one of the buffer layer 110, the first insulation layer 120, the second insulation layer 130, the third insulation layer 140, the fourth insulation layer 150 and the fifth insulation layer 160 may extend into a peripheral area of the base substrate 100 to be disposed outside edges of the organic films 100a and 100c. The buffer layer 110, the first insulation layer 120, the second insulation layer 130, the third insulation layer 140, the fourth insulation layer 150 and the fifth insulation layer 160 may be deposited by using a same mask to have a substantially same planar shape and a same size. However, embodiments are not limited thereto. For example, the buffer layer 110, the first insulation layer 120, the second insulation layer 130, the third insulation layer 140, the fourth insulation layer 150 and the fifth insulation layer 160 may have different planar shapes or different sizes from each other.

Referring to FIG. 6, at least one of the buffer layer 110, the first insulation layer 120, the second insulation layer 130, the third insulation layer 140, the fourth insulation layer 150 and the fifth insulation layer 160 may extend into the bending area BA on the base substrate 100.

FIG. 7 is a plan view illustrating a first mask used for forming a contact hole in a method for manufacturing a display device according to an embodiment. FIG. 12 is a plan view illustrating a light-exposed portion of a first photoresist film in a method for manufacturing a display device according to an embodiment.

Referring to FIGS. 7 to 10, a photoresist composition may be coated on the fifth insulation layer 160 to form a first photoresist film PL1. For example, the photoresist composition may be a positive-type photoresist composition including a photo-acid generator. In the first photoresist film PL1 formed from the positive-type photoresist composition, solubility may be increased by light. Thus, a light-exposed portion may be removed by a developer.

In an embodiment, a first mask MK1 used for exposing the first photoresist film PL1 to a light may include a first transmitting portion TA1*a*, a second transmitting portion TA1*b* and a third transmitting portion TA1*c*.

The first transmitting portion TA1*a* may overlap a portion of the pixel PX of the base substrate 100. For example, a first light-exposed portion EP1*a* of the first photoresist film PL1, which may be exposed to a light through the first transmitting portion TA1*a*, may overlap the first active pattern AP1.

The second transmitting portion TA1*b* may overlap a peripheral area of the base substrate 100 or the carrier substrate CS. For example, a second light-exposed portion EP1*b* of the first photoresist film PL1, which may be exposed to a light through the second transmitting portion TA1*b*, may have a planar shape extending along at least a side of the carrier substrate CS. For example, the second transmitting portion TA1*b* may be disposed along fourth sides of the carrier substrate CS.

The second light-exposed portion EP1*b* may be spaced apart from an edge of the carrier substrate CS in a horizontal direction. Furthermore, the second light-exposed portion EP1*b* may not overlap the organic films 100*a* and 100*c* of the base substrate 100, and may overlap the inorganic layers disposed outside the organic films 100*a* and 100*c*. Thus, the second light-exposed portion EP1*b* may be disposed between the edge of the carrier substrate CS and the edges of the organic films 100*a* and 100*c*, in a plan view.

Hereinafter, "inorganic layer" may refer to at least one of the first to fifth insulation layers 110, 120, 130, 140, 150 and 160, the buffer layer 110 and the inorganic barrier films 100*b* and 100*d* of the base substrate 100.

The third transmitting portion TA1*c* may overlap the bending area of the base substrate 100. For example, a third light-exposed portion EP1*c* of the first photoresist film PL1, which may be exposed to a light through the third transmitting portion TA1*c*, may overlap the inorganic layers disposed in the bending area.

Referring to FIG. 11, a light may be provided to a peripheral area of the carrier substrate CS. The above process may be referred to as an edge-exposure process. The edge-exposure process may be performed without a mask. For example, the edge-exposure process may be performed by an edge-exposure part 300 included in a light-exposure apparatus.

Referring to FIG. 12, a light-exposed edge portion EP1*d* may include edges (e.g., entire edges) of the first photoresist film PL1. For example, the light-exposed edge portion EP1*d* may have a frame shape surrounding the base substrate 100, in a plan view.

Furthermore, the light-exposed edge portion EP1*d* may partially overlap the second light-exposed portion EP1*b*. Thus, a peripheral portion of the first photoresist film PL1 may be exposed (e.g., entirely exposed) to a light.

In case that the edge-exposure process may not be performed, a photoresist film may remain on the edges of the carrier substrate CS. The remainder of the photoresist film may cause defects or failures in following processes such as a process of transferring the carrier substrate CS.

A developer may be provided to the first photoresist film PL1 to remove the light-exposed portions EP1*a*, EP1*b*, EP1*c* and EP1*d* to form a first photoresist pattern PR1.

Figure 13:
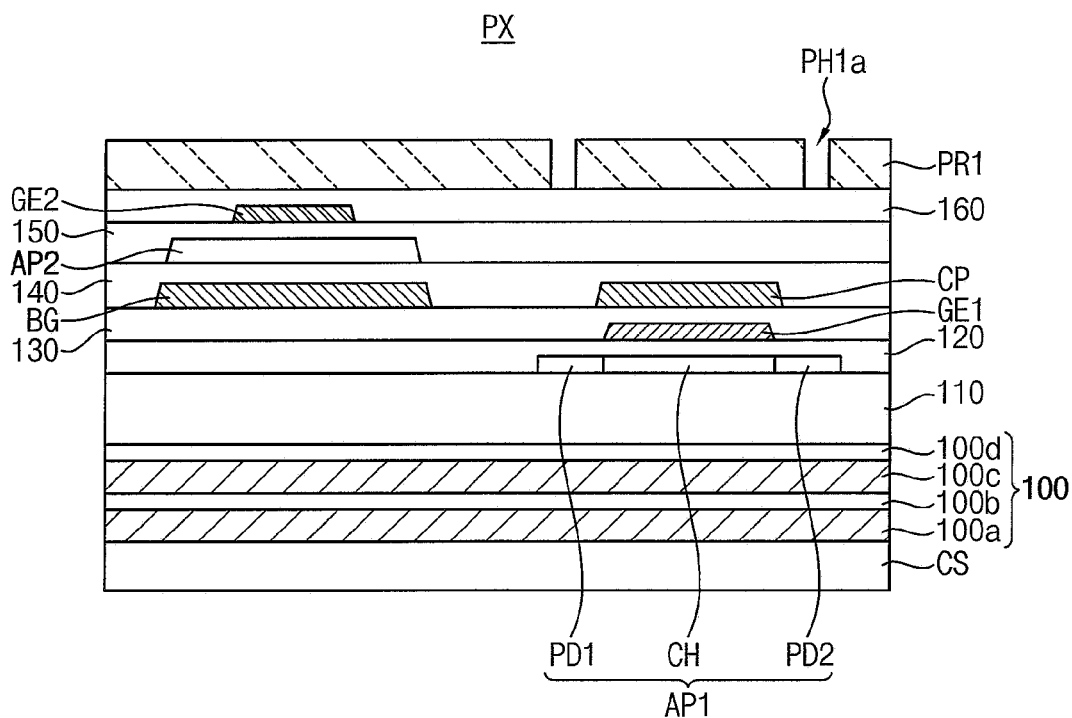

Referring to FIG. 13, the first photoresist pattern PR1 may include a first opening PH1*a* overlapping the first active pattern AP1.

Figure 14:
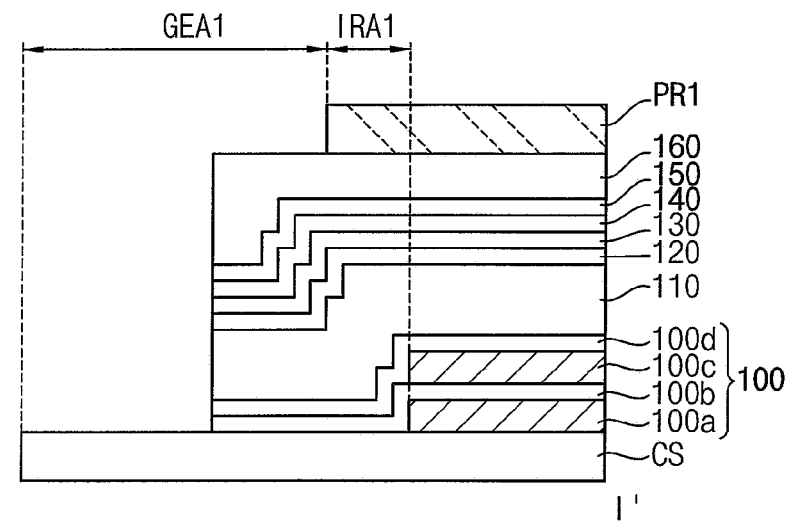

Referring to FIG. 14, the peripheral portion of the first photoresist film PR1, which overlaps the edges of the carrier substrate CS, may be removed (e.g., entirely removed) by the mask-exposure process and the edge-exposure process. Thus, the first photoresist pattern PR1 may not be disposed in the peripheral area including the edges of the carrier substrate CS. A portion of the first photoresist pattern PR1 may be disposed on the inorganic layers outside the edges of the organic films 100*a* and 100*c* of the base substrate 100.

An area disposed outside the organic films 100*a* and 100*c* of the base substrate 100 and overlapping the inorganic layers and the first photoresist pattern PR1 may be referred to as a first inorganic-remaining area IRA1. An area disposed outside the organic films 100*a* and 100*c* of the base substrate 100 and uncovered by the first photoresist pattern PR1 may be referred to as a first periphery-etched area GEA1. In the first periphery-etched area GEA1, an upper surface of the inorganic layer extending outwardly from the edges of the organic films 100*a* and 100*c* of the base substrate 100, for example, an upper surface of the fifth insulation layer 160 may be exposed.

Figure 15:
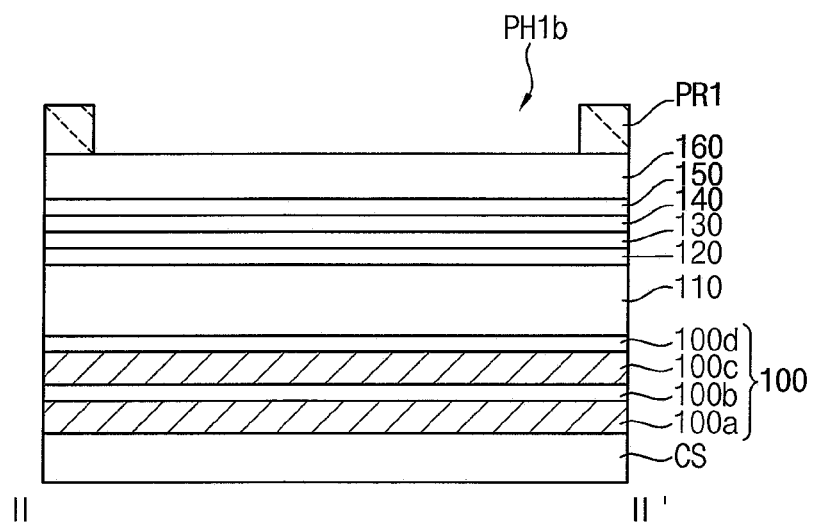

Referring to FIG. 15, the first photoresist pattern PR1 may include a second opening PH1*b* overlapping the bending area. Thus, an upper surface of the inorganic layer disposed under the first photoresist pattern PR1, for example, an upper surface of the fifth insulation layer 160 may be exposed through the second opening PH1*b*.

At least one of the inorganic layers disposed under the first photoresist pattern PR1 may be etched by using the first photoresist pattern PR1 as a mask. For example, dry-etching may be performed to etch the inorganic layers.

Figure 16:
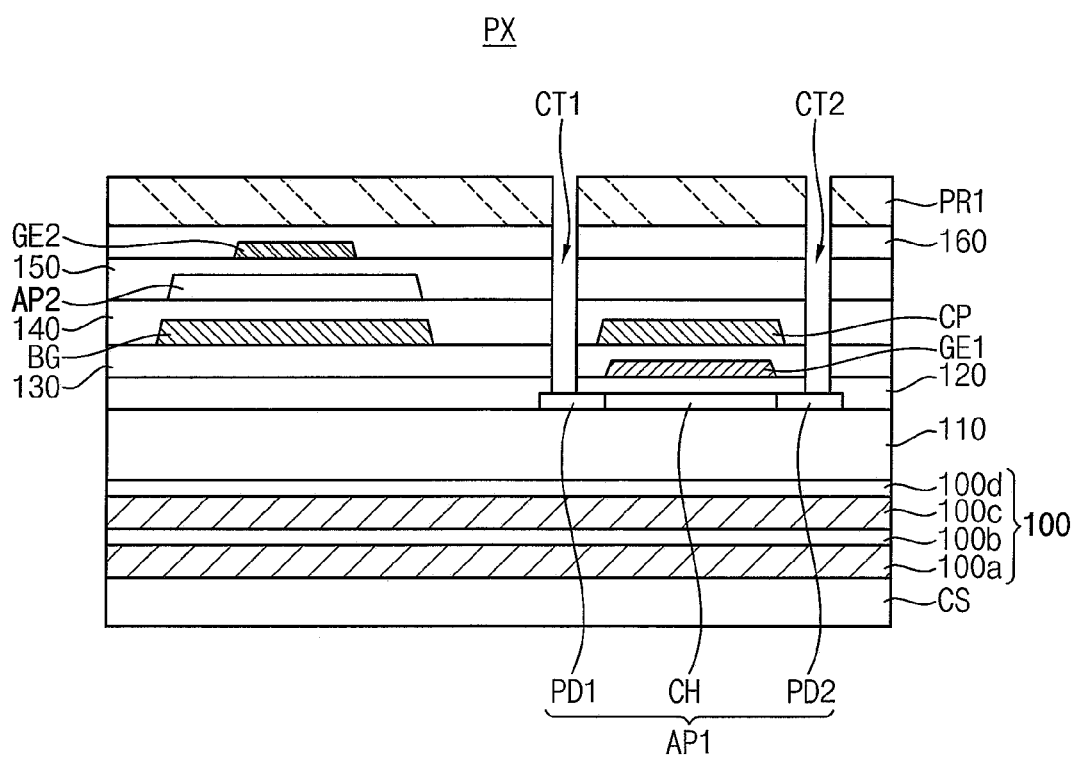

Referring to FIG. 16, the fifth insulation layer 160, the fourth insulation layer 150, the third insulation layer 140, the second insulation layer 130 and the first insulation layer 120, which may be uncovered by the first photoresist pattern PR1, may be etched in the area of the pixel PX to form a first contact hole CT1 and a second contact hole CT2. For example, the first contact hole CT1 may expose the first doped area PD1 of the first active pattern AP1, and the second contact hole CT2 may expose the second doped area PD2 of the first active pattern AP1.

Figure 17:
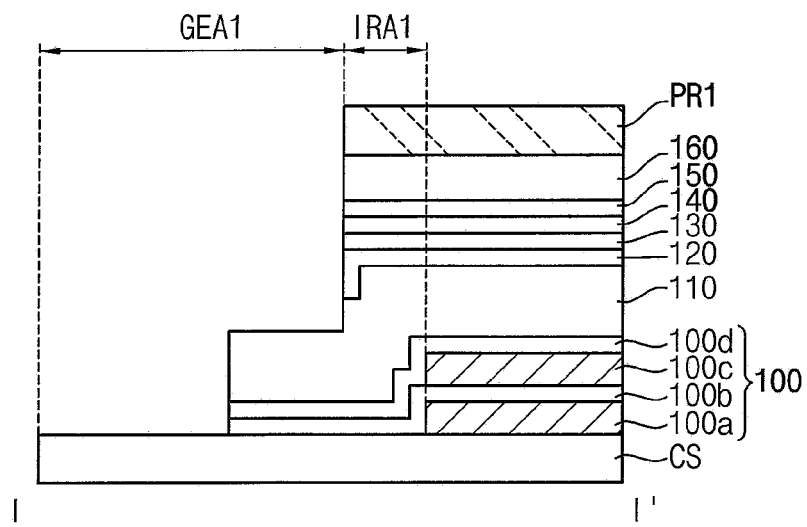

Referring to FIG. 17, at least one of the inorganic layers may be etched in the peripheral area of the carrier substrate CS. In an embodiment, at least one of the inorganic layers may be etched in the first periphery-etched area GEA1 where the first photoresist pattern PR1 may not be disposed. For example, the fifth insulation layer 160, the fourth insulation layer 150, the third insulation layer 140, the second insulation layer 130 and the first insulation layer 120 may be etched to expose an upper surface of the buffer layer 110. However, embodiments are not limited thereto. Layers etched in the above process may be varied depending on an etching depth or the like. For example, a portion of the buffer layer 110 may be further etched.

Figure 18:
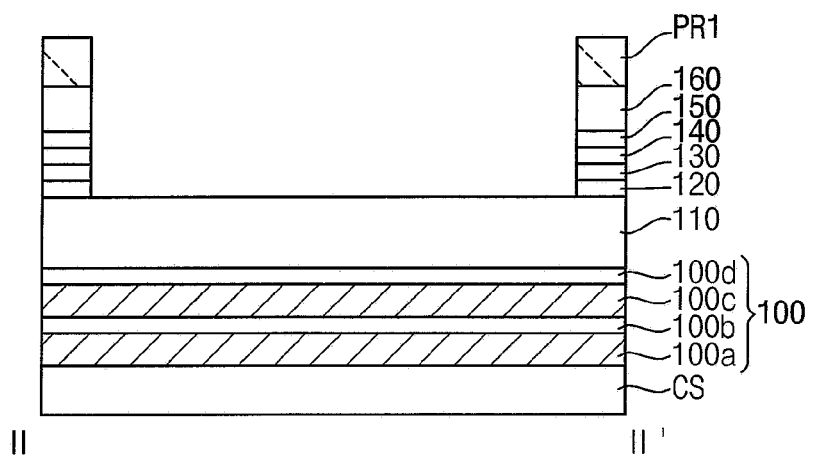

Referring to FIG. 18, at least one of the inorganic layers may be etched in the bending area. For example, the fifth insulation layer 160, the fourth insulation layer 150, the third insulation layer 140, the second insulation layer 130 and the first insulation layer 120 may be etched to expose an upper surface of the buffer layer 110. However, embodiments are not limited thereto. Layers etched in the above process may be varied depending on an etching depth or the like. For example, a portion of the buffer layer 110 may be further etched.

After the first inorganic-etching process may be performed, the first photoresist pattern PR1 may be removed.

Figure 19:
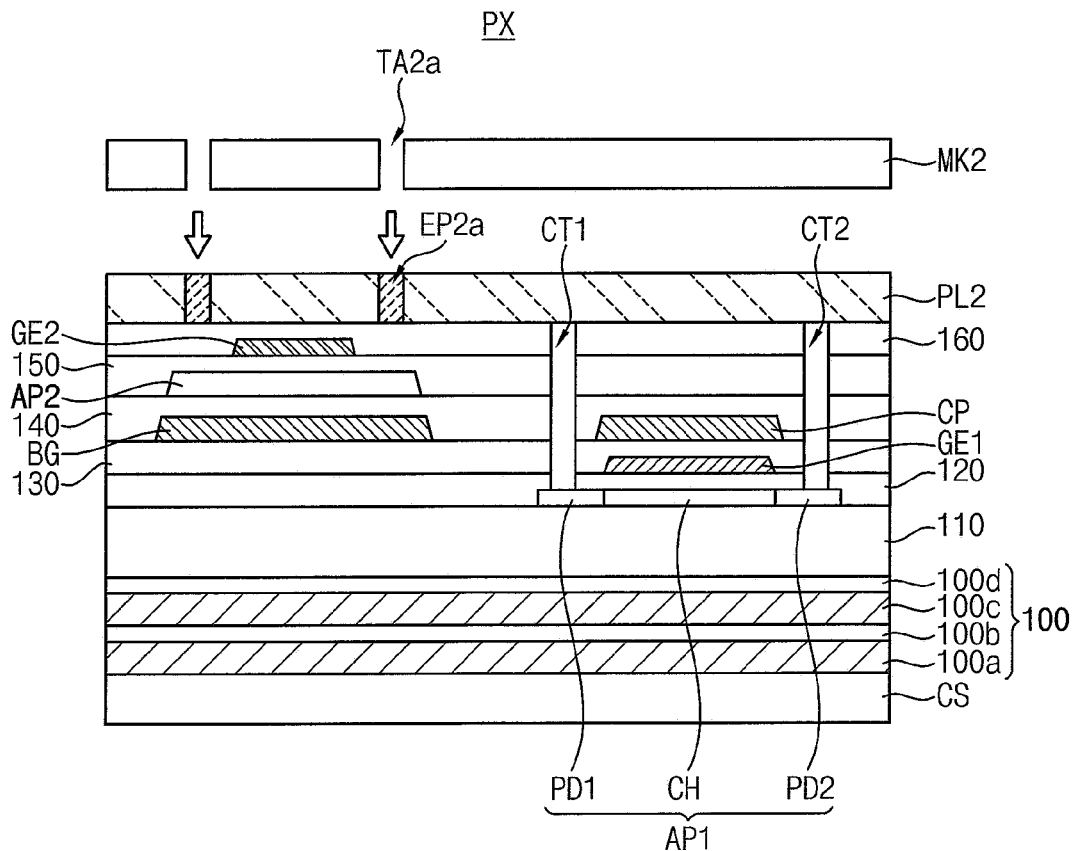
Figure 20:
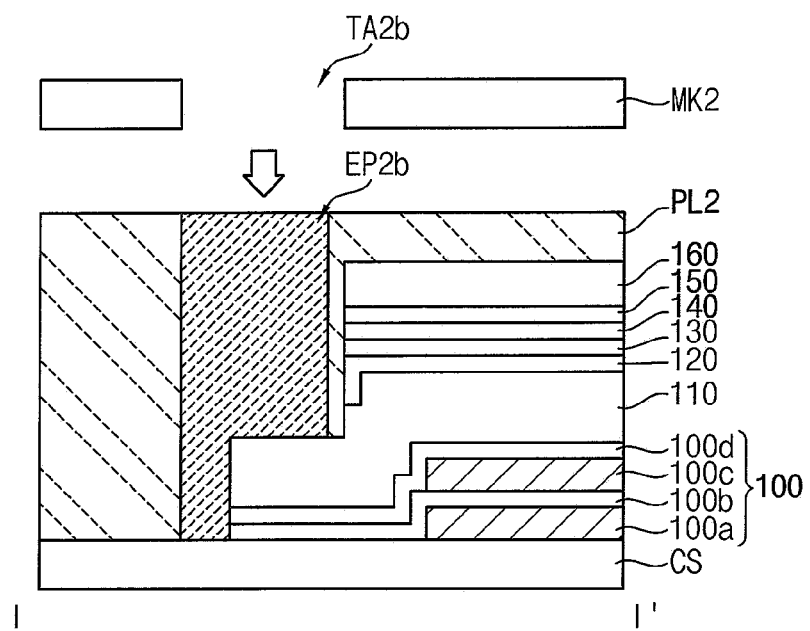
Figure 21:
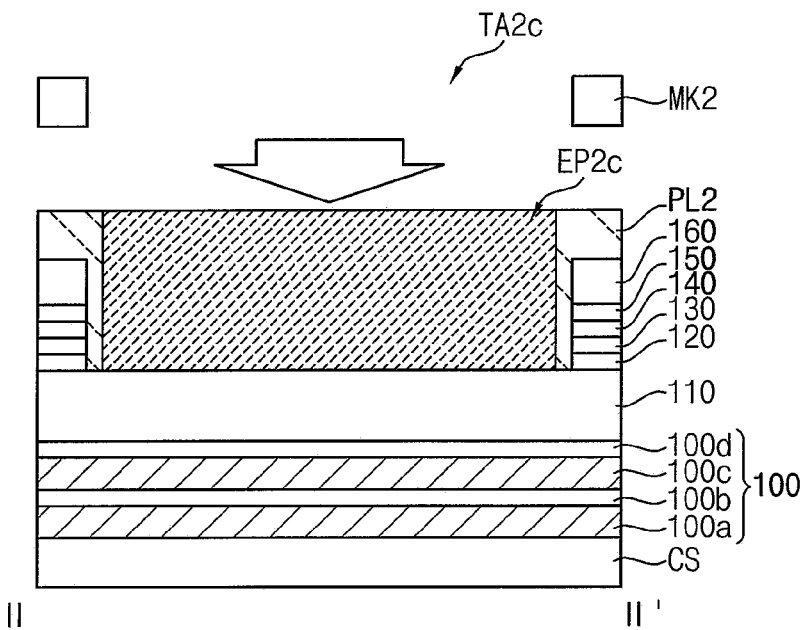

Referring to FIGS. 19 to 21, a photoresist composition may be coated on the fifth insulation layer 160 to form a second photoresist film PL2.

In an embodiment, a second mask MK2 used for exposing the second photoresist film PL2 to a light may include a first transmitting portion TA2a, a second transmitting portion TA2b and a third transmitting portion TA2c.

The first transmitting portion TA2a may overlap a portion of the pixel PX of the base substrate 100. For example, a first light-exposed portion EP2a of the second photoresist film PL2, which may be exposed to a light through the first transmitting portion TA2a, may overlap the second active pattern AP2.

The second transmitting portion TA2b may overlap the peripheral area of the base substrate 100 or the carrier substrate CS. For example, a second light-exposed portion EP2b of the second photoresist film PL2, which may be exposed to a light through the second transmitting portion TA2b, may have a planar shape extending along at least a side of the carrier substrate CS. For example, the second transmitting portion TA2b may be disposed along fourth sides of the carrier substrate CS like the second transmitting portion TA1b of the first photoresist film PL1 illustrated in FIG. 2.

The second light-exposed portion EP2b may be spaced apart from the edge of the carrier substrate CS in a horizontal direction. Furthermore, the second light-exposed portion EP2b may not overlap the organic films 100a and 100c of the base substrate 100, and may overlap the inorganic layers disposed outside the organic films 100a and 100c.

The third transmitting portion TA2c may overlap the bending area of the base substrate 100. For example, a third light-exposed portion EP2c of the second photoresist film PL2, which may be exposed to a light through the third transmitting portion TA2c, may overlap the inorganic layers disposed in the bending area.

Figure 22:
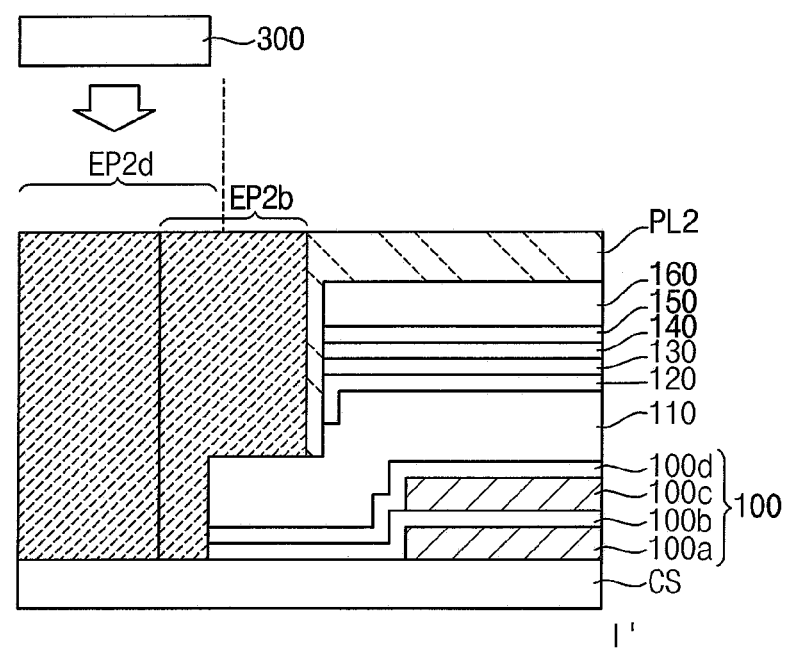

Referring to FIG. 22, after the light-exposure using the second mask MK2, the peripheral area of the carrier substrate CS may be exposed to a light. The edge-exposure process may be performed without using a mask.

A light-exposed edge portion EP2d may include edges (e.g., entire edges) of the second photoresist film PL2. Furthermore, the light-exposed edge portion EP2d may partially overlap the second light-exposed portion EP2b. Thus, a peripheral portion of the second photoresist film PL2 may be exposed (e.g., entirely exposed) to a light.

A developer may be provided to the second photoresist film PL2 to remove the light-exposed portions EP2a, EP2b, EP2c and EP2d to form a second photoresist pattern PR2. At least one of the inorganic layers disposed under the second photoresist pattern PR2 may be etched by using the second photoresist pattern PR2 as a mask. For example, dry-etching may be performed to etch the inorganic layers.

Figure 23:
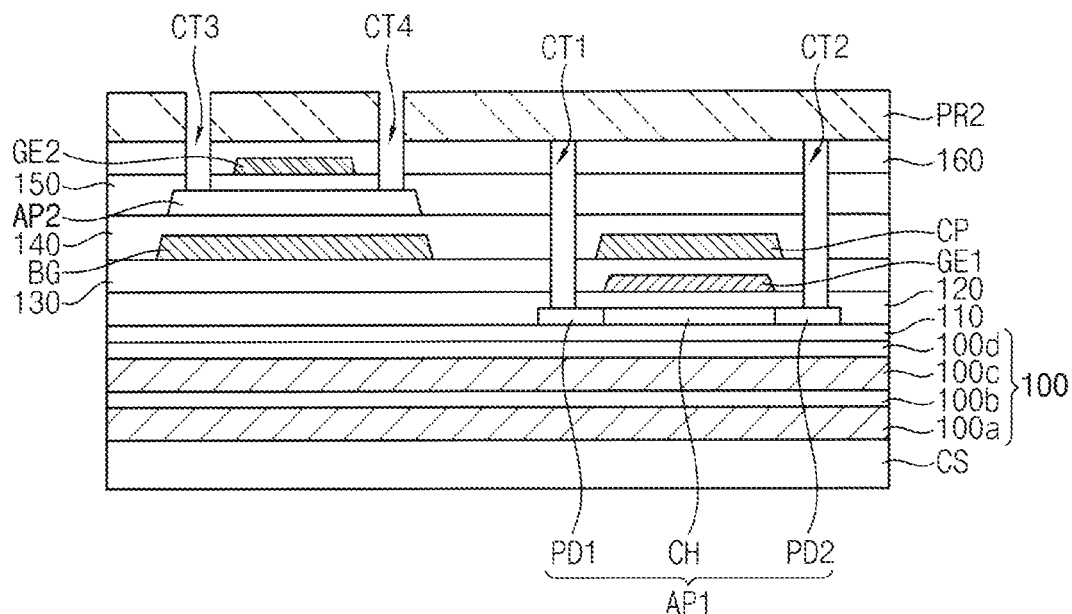

Referring to FIG. 23, the second photoresist pattern PR2 may include a first opening overlapping the second active pattern AP2. The fifth insulation layer 160 and the fourth insulation layer 150 may be etched under the first opening to form a third contact hole CT3 and a fourth contact hole CT4, which expose the second active pattern AP2.

Figure 24:
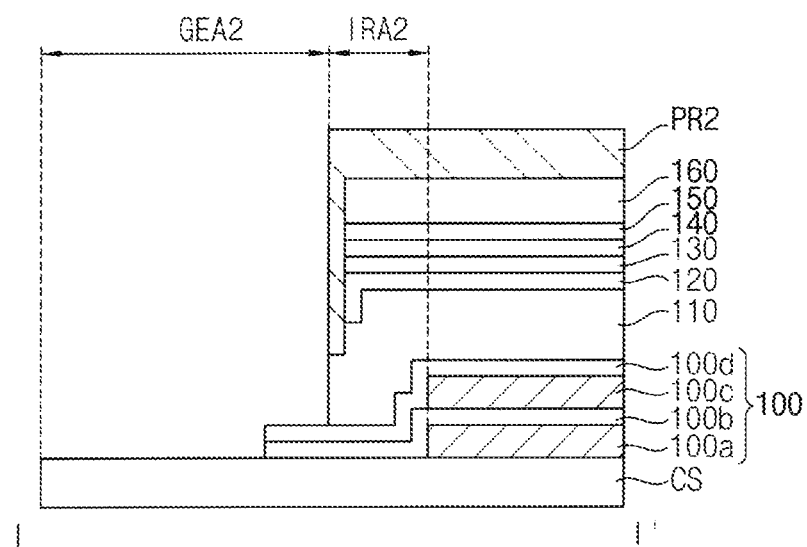

Referring to FIG. 24, the peripheral portion of the second photoresist film, which overlaps the edges of the carrier substrate CS may be removed (e.g., entirely removed) by the mask-exposure process and the edge-exposure process. Thus, the second photoresist pattern PR2 may not be disposed in the peripheral area overlapping the edges of the carrier substrate CS. A portion of the second photoresist pattern PR2 may be disposed on the inorganic layer outside the edges of the organic films 100a and 100c of the base substrate 100.

An area disposed outside the organic films 100a and 100c of the base substrate 100 and overlapping the inorganic layer and the second photoresist pattern PR2 may be referred to as a second inorganic-remaining area IRA2. An area disposed outside the organic films 100a and 100c of the base substrate 100 and uncovered by the second photoresist pattern PR2 may be referred to as a second periphery-etched area GEA2. In the second periphery-etched area GEA2, at least one of the inorganic layers may be etched.

Layers etched in the above process may be varied depending on an etching depth, a thickness of the layers, or the like. In an embodiment, sum of a thickness of the buffer layer 110 and a thickness of the second inorganic barrier film 100d may be larger than sum of a thickness of the fourth insulation layer 150 and a thickness of the fifth insulation layer 160.

For example, the buffer layer 110 may be removed in the second periphery-etched area GEA2, and at least a portion of the second inorganic barrier film 100d may remain in the second periphery-etched area GEA2.

Figure 25:
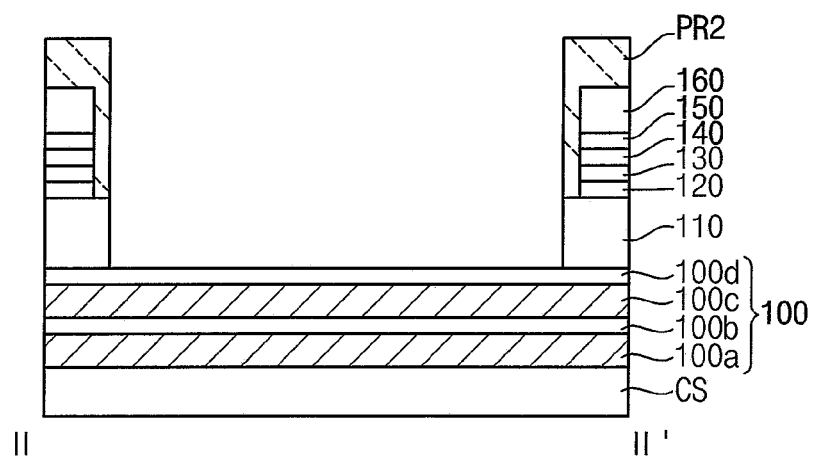

Referring to FIG. 25, the second photoresist pattern PR2 may include a second opening overlapping the bending area. At least one of the inorganic layers may be etched under the second opening. For example, the buffer layer 110 may be etched, and at least a portion of the second inorganic barrier film 100d may remain, in the bending area.

After the second inorganic-etching process, the second photoresist patter PR2 may be removed.

Figure 26:
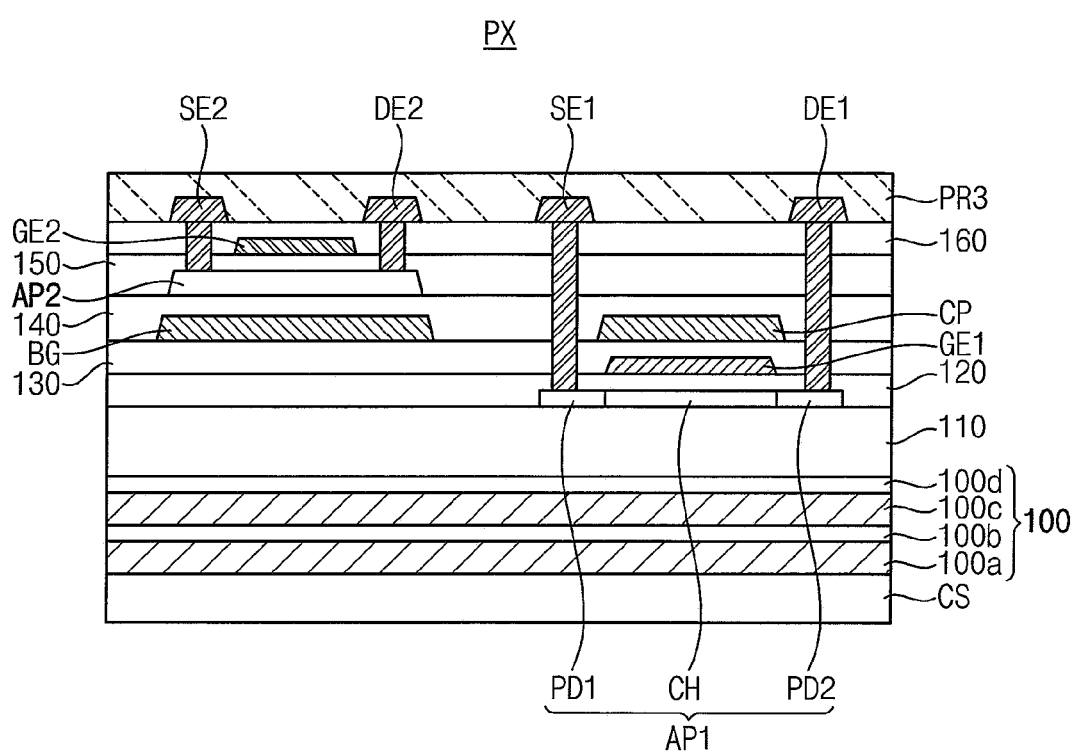

Referring to FIG. 26, a first source metal layer may be formed on the fifth insulation layer 160, and patterned to form a first source metal pattern including a first source pattern SE1, a first drain pattern DE1, a second source pattern SE2 and a second drain pattern DE2.

The first source metal layer may include a metal, a metal alloy, a metal nitride, a conductive metal oxide, or the like, or a combination thereof. For example, the first source metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multiple-layered structure including different metal layers.

The first active pattern AP1 with the first gate electrode GE1 or with the first gate electrode GE1, the first source pattern SE1 and the first drain pattern DE1 may consist of a first transistor. For example, the first transistor including a polysilicon channel may function as a driving transistor to provide a driving current to an organic light-emitting element.

The second active pattern AP2 with the second gate electrode GE2 or with the second gate electrode GE2, the second source pattern SE2 and the second drain pattern DE2 may consist of a second transistor. For example, the second transistor including a metal oxide channel may function as a switching transistor to operate other transistors including the first transistor.

However, embodiments are not limited thereto. In another embodiment, the first transistor may function as a switching transistor, and the second transistor may function as a driving transistor.

A third photoresist pattern PR3 may be formed on the first source metal pattern. At least one of the inorganic layers in the bending area may be etched by using the third photoresist pattern PR3 as a mask. In an embodiment, the in organic layers may be removed (e.g., entirely removed) in the bending area. Thus, reliability deterioration due to crack of an inorganic layer remaining in the bending area may be prevented.

A third mask used for forming the third photoresist pattern PR3 may include at least a transmitting area overlapping the bending area. The third mask may further include a transmitting area overlapping the peripheral area of the base substrate 100 or the carrier substrate CS like the first mask MK1 or the second mask MK2. However, embodiments are not limited thereto. For example, the third mask may include only the transmitting area overlapping the bending area.

Figure 27:
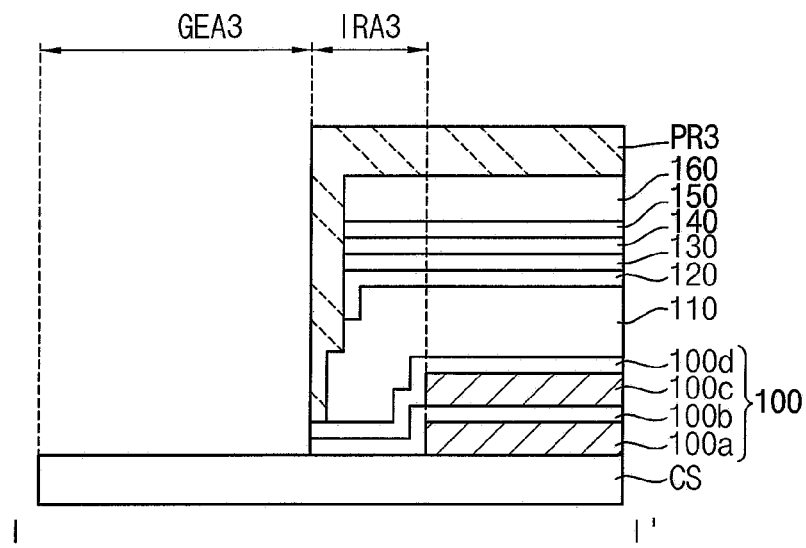

Referring to FIG. 27, the third photoresist pattern PR3 may not be disposed in the peripheral area including the edge of the carrier substrate CS. A portion of the third photoresist pattern PR3 may be disposed on the inorganic layer outside the edges of the organic films 100a and 100c of the base substrate 100.

An area disposed outside the organic films 100a and 100c of the base substrate 100 and overlapping the inorganic layer and the third photoresist pattern PR3 may be referred to as a third inorganic-remaining area IRA3. An area disposed outside the organic films 100a and 100c of the base substrate 100 and uncovered by the third photoresist pattern PR3 may be referred to as a third periphery-etched area GEA3.

In the third periphery-etched area GEA3, at least one of the inorganic layers may be etched. As a result, an upper surface of the carrier substrate CS may be exposed in the third periphery-etched area GEA3. However, embodiments are not limited thereto. For example, at least a portion of the first inorganic barrier film 100b may remain in the third periphery-etched area GEA3. Thus, an actual width of an inorganic layer outside the organic films 100a and 100c may be greater than a width of the third inorganic-remaining area IRA3. The actual width of the inorganic layer outside the organic films 100a and 100c may be equal to or greater than about 3 mm. However, embodiments are not limited thereto.

For example, the actual width of the inorganic layer, a distance between an edge of the inorganic layer and the edge of the carrier substrate CS, a distance between the edge of the carrier substrate CS and the edge of the organic films 100a and 100c or the like may be variously designed as desired, and may be varied depending on positions and directions thereof.

Figure 28:
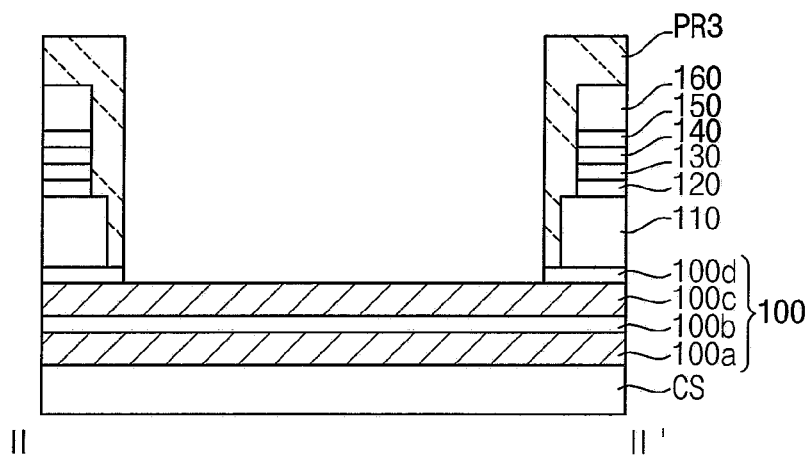

Referring to FIG. 28, the third photoresist pattern PR3 includes an opening overlapping the bending area. Thus, at least one of the inorganic layers may be removed under the opening. For example, the second inorganic barrier film 100d may be removed in the bending area. As a result, an upper surface of the second organic film 100c may be exposed in the bending area.

After the third inorganic-etching process, the third photoresist pattern PR3 may be removed.

In case that a process for etching an inorganic layer may be repeated, an area where an inorganic layer contacts the carrier substrate CS may be decreased, which may reduce adhesion between the base substrate 100 and the carrier substrate CS thereby causing undesired separation. In case that an area light-exposed by an edge-exposure part may be reduced to increase a size of the area where an inorganic layer contacts the carrier substrate CS, a photoresist pattern may undesirably remain in the peripheral area of the carrier substrate CS thereby causing failures of manufacturing processes.

According to embodiments, an area light-exposed by an edge-exposure part, which has a relatively great process margin (e.g., size of misalignment), may be reduced, and a peripheral area of a carrier substrate may be further exposed to a light through a mask to compensate for the reduced area light-exposed by the edge-exposure part. Thus, an area where an inorganic layer contacts the carrier substrate may be substantially increased while preventing a photoresist from remaining in the peripheral area of the carrier substrate.

Furthermore, in the above etching processes, inorganic layers may be removed in a bending area. Thus, reliability deterioration due to crack of an inorganic layer remaining in the bending area may be prevented.

In an embodiment, exposing the peripheral area of the carrier substrate to a light using a mask may be performed in a first inorganic-etching process and a second inorganic-etching process. However, embodiments are not limited thereto. For example, exposing the peripheral area of the carrier substrate to a light using a mask may be performed in one or all of a first inorganic-etching process, a second inorganic-etching process and a third inorganic-etching process.

Furthermore, the third inorganic-etching process may be omitted by adjusting an etching depth of the first inorganic-etching process or the second inorganic-etching process.

Figure 29:
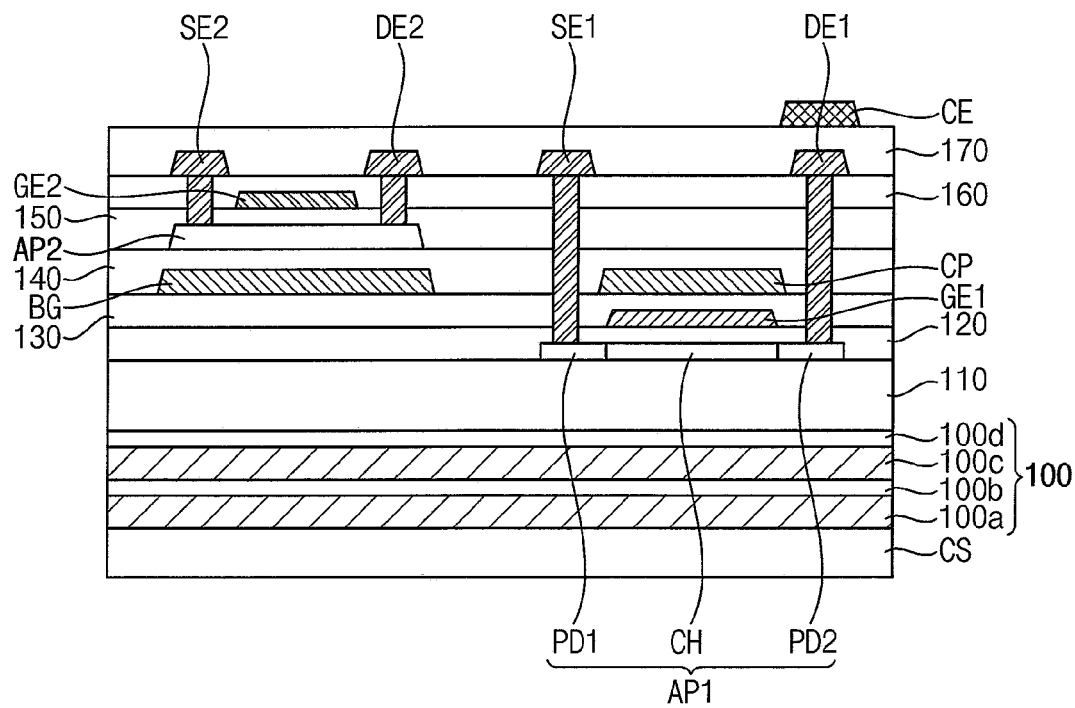
Figure 30:
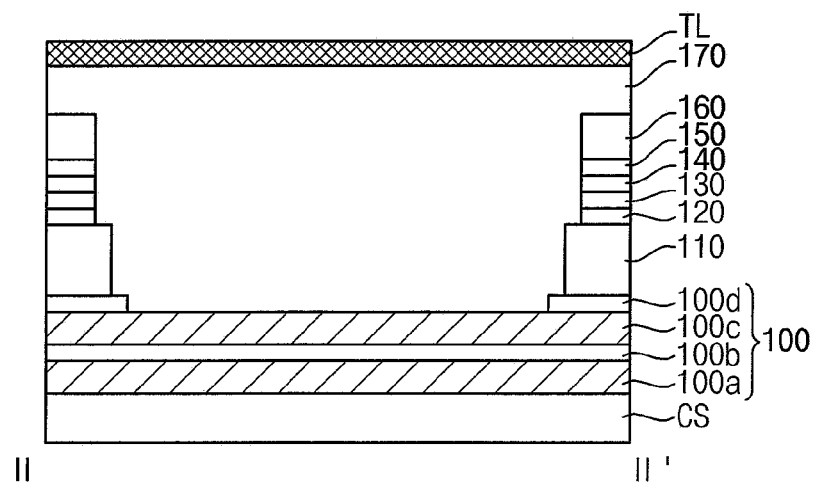

Referring to FIGS. 29 and 30, a sixth insulation layer 170 may be formed to cover the first source metal pattern. Furthermore, the sixth insulation layer 170 may fill the area of the bending area, where the inorganic layers may be removed. The portion of the sixth insulation layer 170 may be referred to as an organic filling portion.

For example, the sixth insulation layer 170 may include an organic insulation material such as a phenol resin, an acryl resin, a polyimide resin, a polyamide resin, a siloxane resin, an epoxy resin, or the like, or a combination thereof. The sixth insulation layer 170 may be referred to as a first via insulation layer.

A second source metal pattern including a connection electrode CE may be formed on the sixth insulation layer 170. The connection electrode CE may pass through the sixth insulation layer 170 to electrically contact the first drain pattern DEL The second source metal pattern may further include a transfer wiring TL passing through the bending area. The transfer wiring TL may be electrically connected to the pad part in the connection area CA illustrated in FIG. 1 to transfer a driving signal, a power voltage or the like to the display area. Furthermore, the transfer wiring TL may transfer a control signal to a driver formed in a peripheral area adjacent to the display area.

For example, the second source metal pattern may include a metal, a metal alloy, a metal nitride, a conductive metal oxide, or the like, or a combination thereof. For example, the second source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multiple-layered structure including different metal layers.

Figure 31:
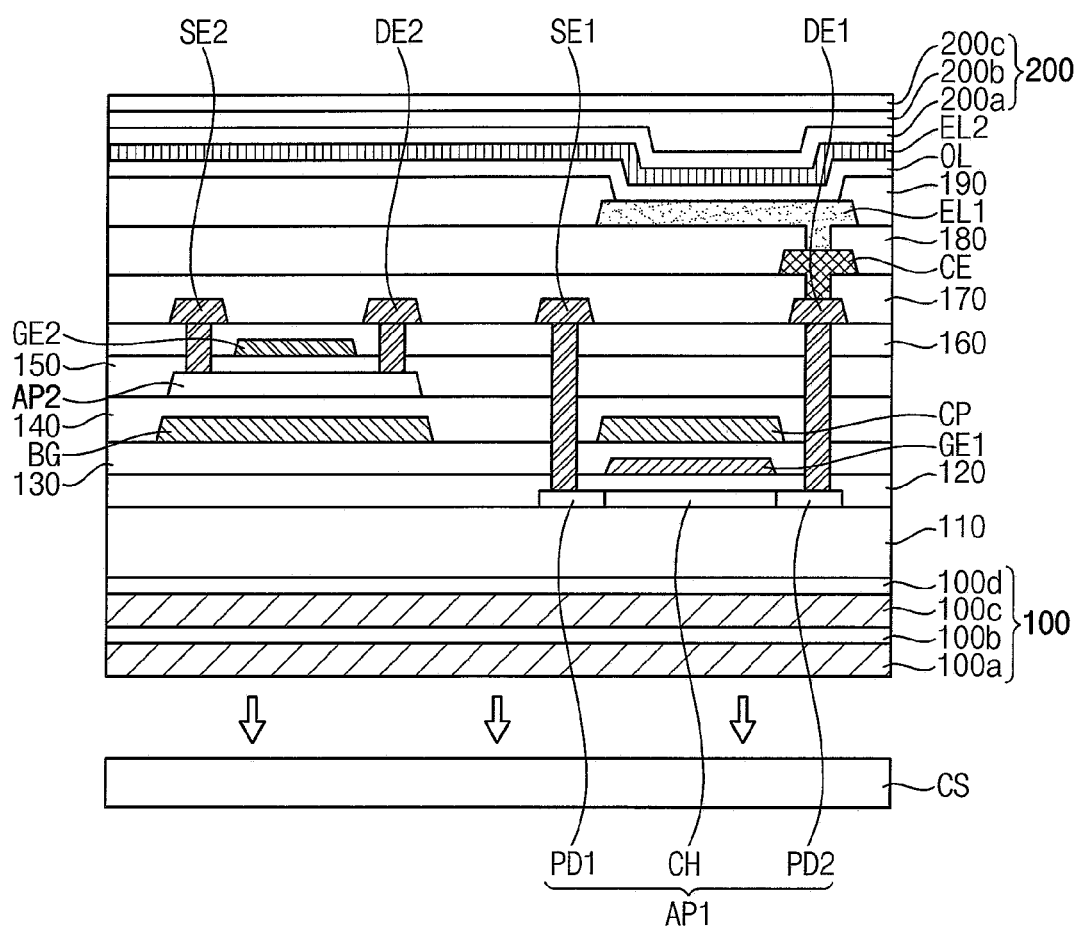

Referring to FIG. 31, a seventh insulation layer 180 may be formed to cover the second source metal pattern.

A first electrode EL1 of an organic light-emitting diode may be formed on the seventh insulation layer 180. The first electrode EL1 may pass through the seventh insulation layer 180 to electrically contact the connection electrode CE.

For example, the seventh insulation layer 180 may include an organic insulation material such as a phenol resin, an acryl resin, a polyimide resin, a polyamide resin, a siloxane resin, an epoxy resin, or the like, or a combination thereof. The seventh insulation layer 180 may be referred to as a second via insulation layer.

The first electrode EL1 may function as an anode. For example, the first electrode EL1 may be formed as a transmitting electrode or a reflecting electrode according to an emission type of the display device. In case that the first electrode EL1 may be a transmitting electrode, the first electrode EL1 may include indium tin oxide, indium zinc oxide, zinc tin oxide, indium oxide, zinc oxide, tin oxide, or the like, or a combination thereof. In case that the first electrode EL1 may be a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti), or a combination thereof, and may have a stacked structure further including the material that may be used for the transmitting electrode.

A pixel-defining layer 190 may be formed on the seventh insulation layer 180. The pixel-defining layer 190 may include an opening that exposes at least a portion of the first electrode EL1. For example, the pixel-defining layer 190 may include an organic insulation material.

An organic light-emitting layer OL may be formed on the first electrode EL1. The organic light-emitting layer OL may include at least an emission layer, and may further include at least one of a hole injection layer (HIL), a hole transporting layer (HTL), an electron transporting layer (ETL) and an electron injection layer (EIL). For example, the organic light-emitting layer OL may include a low molecular weight organic compound or a high molecular weight organic compound.

In an embodiment, the organic light-emitting layer OL may emit a red light, a green light or a blue light. In another embodiment, the organic light-emitting layer OL may emit a white light. The organic light-emitting layer OL emitting a white light may have a multiple-layer structure including a red-emitting layer, a green-emitting layer and a blue-emitting layer, or a single-layer structure including a mixture of a red-emitting material, a green-emitting material and a blue-emitting material.

For example, the organic light-emitting layer OL may be formed by a screen printing method, an inkjet printing method, a deposition method, or the like.

A second electrode EL2 may be formed on the organic light-emitting layer OL. In an embodiment, the second electrode EL2 may function as a cathode. For example, the second electrode EL2 may be formed as a transmitting electrode or a reflecting electrode according to an emission type of the display device. For example, in case that the second electrode EL2 may include a metal, a metal alloy, a metal nitride, a metal fluoride, a conductive metal oxide, or a combination thereof.

For example, the second electrode EL2 may extend continuously across multiple pixels in the display area. In an embodiment, a capping layer and a blocking layer may be formed on the second electrode EL2.

Thereafter, an encapsulation layer 200 may be formed on the organic light-emitting diode. The encapsulation layer 200 may have a stacked structure of inorganic thin films 200a and 200c and an organic thin film 200b. For example, the organic thin film 200b may include a cured polymer resin such as poly(meth)acrylate, an epoxy resin, or the like, or a combination thereof.

For example, the inorganic thin films 200a and 200c may include silicon oxide, silicon nitride, silicon oxynitride, silicon carbide, aluminum oxide, tantalum oxide, hafnium oxide, zirconium oxide, titanium oxide, or a combination thereof.

After the encapsulation layer 200 may be formed, or after other structures may be formed on the encapsulation layer 200, the carrier substrate CS may be separated from the base substrate 100. For example, the carrier substrate CS may be separated from the base substrate 100 by laser irradiation or the like.

Figure 32:
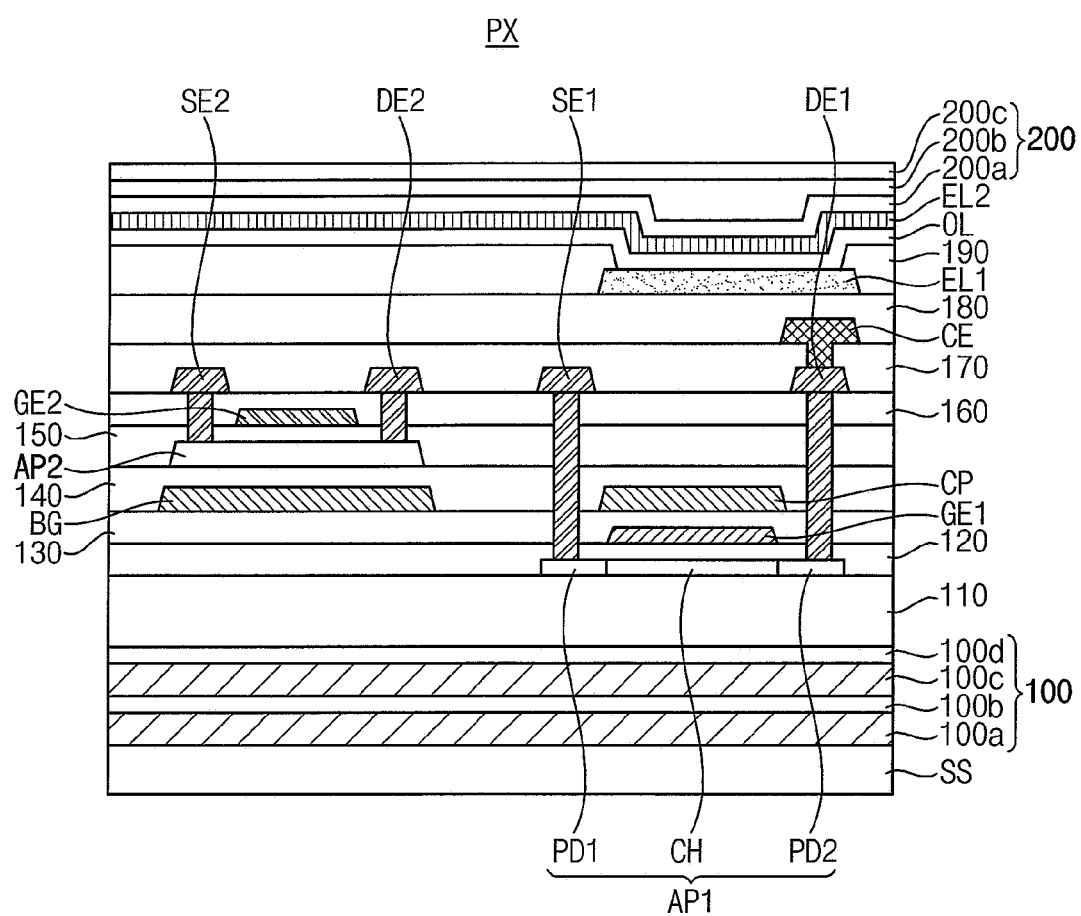

Referring to FIG. 32, a supporting substrate SS may be adhered on a lower surface of the base substrate 100 after the carrier substrate CS may be separated from the base substrate 100. For example, an adhesive layer may be provided between the base substrate 100 and the supporting substrate SS.

For example, the supporting substrate SS may include a polymeric material such as polymethylmethacrylate (PMMA), polycarbonate (PC), polyethylene terephthalate (PET), or the like, or a combination thereof.

Figure 33:
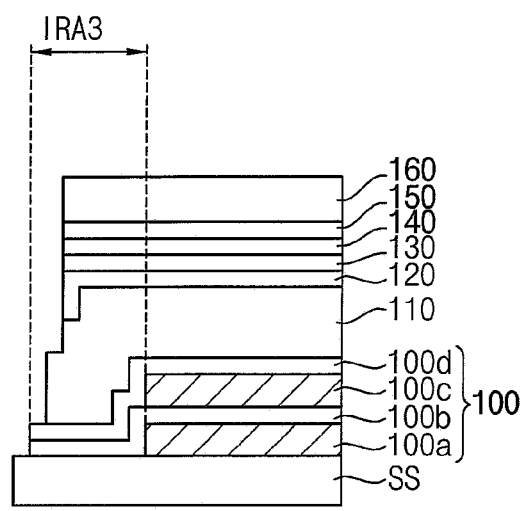

Referring to FIG. 33, at least one of the inorganic layers may extend outwardly from the edges of the organic films 100a and 100c of the base substrate 100. Thus, the supporting substrate SS may be adhered to a lower surface of the organic film and to a lower surface of the inorganic layer protruding from the edge of the organic film. For example, the supporting substrate SS may be adhered to a lower surface of the first organic film 100a and to a lower surface of the first inorganic barrier film 100b.

In an embodiment, a width of an inorganic-protruding area IRA where the inorganic layer may be disposed outside the edge of the organic film and adhered to the supporting substrate SS may be equal to or greater than about 3 mm. For example, the width of the inorganic-protruding area IRA may be about 3 mm to about 5 mm.

Embodiments may be applied to various display devices. For example, an embodiment may be applied to a vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the inventive concept. Accordingly, all such modifications are intended to be included within the scope of the inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the inventive concept, as set forth in the following claims and equivalents thereof.

What is claimed is:

1. A method for manufacturing a display device, the method comprising:
    forming a base substrate on a carrier substrate, the base substrate including:
        an organic film including a polymeric material; and
        an inorganic barrier film overlapping the organic film and extending outwardly from an edge of the organic film;
    forming a first active pattern including a semiconductive material in a display area of the base substrate;
    forming a first interlayer insulation layer on the first active pattern;
    forming a second active pattern on the first interlayer insulation layer in the display area of the base substrate, the second active pattern including a semiconductive material different from the first active pattern;

forming a second interlayer insulation layer on the second active pattern;

forming a photoresist film on the second interlayer insulation layer;

exposing the photoresist film to light through a first mask including:
- a first transmitting portion overlapping the first active pattern or the second active pattern; and
- a second transmitting portion disposed between an edge of the carrier substrate and the edge of the organic film;

exposing an edge portion of the photoresist film to light, the edge portion of the photoresist film overlapping the edge of the carrier substrate;

developing the photoresist film to form a first photoresist pattern that includes a first opening and does not overlap the edge of the carrier substrate, the first opening overlapping the first active pattern or the second active pattern; and forming a contact hole exposing the first active pattern or the second active pattern by using the first photoresist pattern as a mask.

2. The method of claim 1, wherein
the first mask further includes a third transmitting portion overlapping a bending area of the base substrate,
the first photoresist pattern further includes a second opening overlapping the bending area, and
the second interlayer insulation layer is etched in the bending area upon formation of the contact hole.

3. The method of claim 2, wherein the contact hole exposes the first active pattern, and the method further comprises:
forming a second photoresist pattern on the second interlayer insulation layer, the second photoresist pattern including a first opening overlapping the second active pattern, and a second opening overlapping the bending area;
forming a contact hole exposing the second active pattern by using the second photoresist pattern as a mask;
forming a first source metal pattern including:
- a first source pattern electrically contacting the first active pattern;
- a first drain pattern electrically contacting the first active pattern and spaced apart from the first source pattern;
- a second source pattern electrically contacting the second active pattern; and
- a second drain pattern electrically contacting the second active pattern and spaced apart from the second source pattern;

forming a third photoresist pattern overlapping the first source metal pattern and including an opening overlapping the bending area; and
etching the inorganic barrier film in the bending area by using the third photoresist pattern as a mask to expose the organic film.

4. The method of claim 3, further comprising:
forming an organic filling portion on an exposed portion of the organic film.

5. The method of claim 4, further comprising:
forming a second source metal pattern including a transfer wiring disposed on the organic filling portion and a connection electrode electrically contacting the first drain pattern.

6. The method of claim 3, wherein the inorganic barrier film includes a portion that extends outwardly from the edge of the organic film and remains after the inorganic barrier film is etched in the bending area, the portion having a width equal to or more than about 3 mm.

7. The method of claim 1, wherein the second transmitting portion overlaps a portion of the inorganic barrier film protruding from the edge of the organic film.

8. The method of claim 7, wherein the second transmitting portion extends along the edge of the carrier substrate.

9. The method of claim 1, wherein the edge portion of the photoresist film is exposed to light without using a mask.

10. The method of claim 9, wherein the light-exposed edge portion of the photoresist film overlaps an area, which is light-exposed through the second transmitting portion of the first mask.

11. The method of claim 10, wherein the light-exposed edge portion of the photoresist film has a frame shape surrounding the base substrate.

12. The method of claim 1, wherein the first active pattern includes polysilicon, and the second active pattern includes a metal oxide.

13. The method of claim 1, wherein the base substrate includes organic films.

14. The method of claim 1, further comprising:
separating the carrier substrate from the base substrate.

* * * * *